(12) United States Patent
Kim

(10) Patent No.: US 11,474,890 B2
(45) Date of Patent: Oct. 18, 2022

(54) MEMORY SYSTEM AND METHOD OF OPERATING MEMORY SYSTEM

(71) Applicant: SK hynix Inc., Icheon-si (KR)

(72) Inventor: Jong Wook Kim, Cheongju-si (KR)

(73) Assignee: SK hynix Inc., Icheon-si (KR)

(*) Notice: Subject to any disclaimer, the term of this patent is extended or adjusted under 35 U.S.C. 154(b) by 450 days.

(21) Appl. No.: 16/665,739

(22) Filed: Oct. 28, 2019

(65) Prior Publication Data

US 2021/0004282 A1 Jan. 7, 2021

(30) Foreign Application Priority Data

Jul. 2, 2019 (KR) .................. 10-2019-0079709

(51) Int. Cl.
| | |
|---|---|
| *G11C 16/34* | (2006.01) |
| *G06F 11/07* | (2006.01) |
| *G06F 11/30* | (2006.01) |
| *G06F 12/02* | (2006.01) |
| *G11C 29/12* | (2006.01) |
| *G11C 16/16* | (2006.01) |

(Continued)

(52) U.S. Cl.
CPC .......... *G06F 11/076* (2013.01); *G06F 11/073* (2013.01); *G06F 11/3037* (2013.01); *G06F 11/3058* (2013.01); *G06F 12/0246* (2013.01); *G06F 12/0253* (2013.01); *G11C 16/16* (2013.01); *G11C 16/3404* (2013.01); *G11C 16/3445* (2013.01); *G11C 29/12005* (2013.01); *G11C 29/50004* (2013.01); *G11C 29/52* (2013.01)

(58) Field of Classification Search
CPC ............ G11C 16/3404; G11C 16/3445; G11C 29/12005; G11C 29/50004; G11C 29/52; G11C 2029/0409; G11C 16/10; G11C 16/0483; G11C 16/349; G11C 16/3495; G06F 11/3409; G06F 11/3062; G06F 2201/81; G06F 3/064; G06F 3/0652; G06F 3/0653; G06F 3/0658; Y02D 10/00
USPC ............................................ 365/189.09, 201
See application file for complete search history.

(56) References Cited

U.S. PATENT DOCUMENTS 5,200,923 A * 4/1993 Sekiguchi .......... G11C 16/3495
365/201
5,253,206 A * 10/1993 Tanaka ............. G11C 29/50004
365/185.23

(Continued)

FOREIGN PATENT DOCUMENTS

| KR | 100967004 B1 | 6/2010 |
|---|---|---|
| KR | 1020140113190 A | 9/2014 |

*Primary Examiner* — Michael T Tran
(74) *Attorney, Agent, or Firm* — William Park & Associates Ltd.

(57) ABSTRACT

The present technology relates to a memory system and a method of operating the memory system. The memory system includes a memory device including a plurality of semiconductor memories, and a controller for controlling the memory device to perform a test program operation and a threshold voltage distribution monitoring operation on each of the plurality of semiconductor memories during an operation. The controller sets operation performance parameters of each of the semiconductor memories based on monitoring information obtained as a result of the threshold voltage distribution monitoring operation.

23 Claims, 12 Drawing Sheets

(51) Int. Cl.
  *G11C 29/52* (2006.01)
  *G11C 29/50* (2006.01)

(56) References Cited

U.S. PATENT DOCUMENTS

| | | | | |
|---|---|---|---|---|
| 6,044,020 A * | 3/2000 | Chung | ............ | G11C 8/08 |
| | | | | 365/185.11 |
| 6,550,028 B1 * | 4/2003 | Akaogi | ............ | G11C 29/50012 |
| | | | | 365/201 |
| 10,381,095 B1 * | 8/2019 | Date | ............ | G11C 16/16 |
| 11,183,255 B1 * | 11/2021 | Matranga | ............ | G11C 16/3404 |
| 2005/0105333 A1 * | 5/2005 | Park | ............ | G11C 29/50 |
| | | | | 365/185.17 |
| 2005/0286301 A1 * | 12/2005 | Mochizuki | ............ | G11C 29/02 |
| | | | | 365/185.17 |
| 2006/0123280 A1 * | 6/2006 | Tran | ............ | G11C 29/50004 |
| | | | | 714/718 |
| 2006/0279999 A1 * | 12/2006 | Byeon | ............ | G11C 16/16 |
| | | | | 365/185.29 |
| 2008/0013390 A1 * | 1/2008 | Zipprich-Rasch | ............ | G11C 29/50 |
| | | | | 365/201 |
| 2008/0195903 A1 * | 8/2008 | Zipprich-Rasch | ............ | G11C 29/50 |
| | | | | 714/721 |
| 2012/0102259 A1 * | 4/2012 | Goss | ............ | G11C 16/26 |
| | | | | 711/E12.001 |
| 2014/0237298 A1 * | 8/2014 | Pe'er | ............ | G11C 16/3418 |
| | | | | 714/42 |
| 2018/0137925 A1 * | 5/2018 | Nam | ............ | G11C 16/08 |
| 2018/0336961 A1 * | 11/2018 | Yang | ............ | G11C 29/42 |
| 2019/0146864 A1 * | 5/2019 | Nair | ............ | G06F 11/073 |
| | | | | 714/47.2 |
| 2019/0164599 A1 * | 5/2019 | Avraham | ............ | G06F 11/1048 |
| 2019/0179568 A1 * | 6/2019 | Hsu | ............ | G11C 16/3459 |
| 2019/0180822 A1 * | 6/2019 | Dunga | ............ | G11C 16/26 |
| 2020/0402582 A1 * | 12/2020 | Yang | ............ | G06F 3/0679 |
| 2021/0312993 A1 * | 10/2021 | Cho | ............ | G11C 16/10 |
| 2021/0327532 A1 * | 10/2021 | Kim | ............ | G11C 16/16 |

* cited by examiner

MEMORY SYSTEM AND METHOD OF OPERATING MEMORY SYSTEM

CROSS-REFERENCE TO RELATED APPLICATION

The present application claims priority under 35 U.S.C. § 119(a) to Korean patent application number 10-2019-0079709, filed on Jul. 2, 2019, in the Korean Intellectual Property Office, the entire disclosure of which is incorporated herein by reference.

BACKGROUND

Field of Invention

The present disclosure relates to an electronic device, and more particularly, to a memory system and a method of operating the memory system.

Description of Related Art

Recently, a paradigm for a computer environment has been transformed into ubiquitous computing, which enables a computer system to be used whenever and wherever. Therefore, a use of a portable electronic device such as a mobile phone, a digital camera, and a notebook computer is rapidly increasing. Such a portable electronic device generally uses a memory system that uses a memory device, that is, a data storage device. The data storage device is used as a main storage device or an auxiliary storage device of the portable electronic device.

The data storage device using the memory device has advantages that stability and durability are excellent because there is no mechanical driver, an access speed of information is very fast, and power consumption is low. As an example of the memory system having such advantages, a data storage device includes a universal serial bus (USB) memory device, a memory card having various interfaces, a solid state drive (SSD), and the like.

A memory device is largely divided into a volatile memory device and a non-volatile memory device.

A writing speed and a reading speed of the non-volatile memory device are relatively slow, however, the non-volatile memory device maintains storage data even though power supply is shut off. Therefore, a non-volatile memory device is used to store data to be maintained regardless of power supply. A non-volatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

SUMMARY

A memory system according to an embodiment of the present disclosure includes a memory device including a plurality of semiconductor memories, and a controller for controlling the memory device to perform a test program operation and a first threshold voltage distribution monitoring operation on each of the plurality of semiconductor memories during an operation. The controller sets operation performance parameters of each of the semiconductor memories based on first monitoring information obtained as a result of the first threshold voltage distribution monitoring operation.

A memory system according to an embodiment of the present disclosure includes a memory device including a plurality of semiconductor memories each including a plurality of memory blocks, and a controller configured to control the memory device to perform a cam data read operation during a power-on operation and set operation performance parameters of each of the semiconductor memories based on cam data received from the memory device. Each of the plurality of semiconductor memories sequentially performs a test program operation, a first threshold voltage distribution monitoring operation, a test erase operation, and a second threshold voltage distribution monitoring operation, and stores monitoring information obtained as a result of the first and second threshold voltage distribution monitoring operations in a cam block among the plurality of memory blocks as the cam data.

A method of operating a memory system according to an embodiment of the present disclosure includes performing a test program operation and a first threshold voltage distribution monitoring operation on a selected memory block, performing a test erase operation and a second threshold voltage distribution monitoring operation on the selected memory block on which the test program operation is performed, setting an operation performance parameter of the selected memory block based on a result of the first threshold voltage distribution monitoring operation and a result of the second threshold voltage distribution monitoring operation, and performing all operations with reference to the operation performance parameter during all operations of the selected memory block.

DETAILED DESCRIPTION

Figure 1:
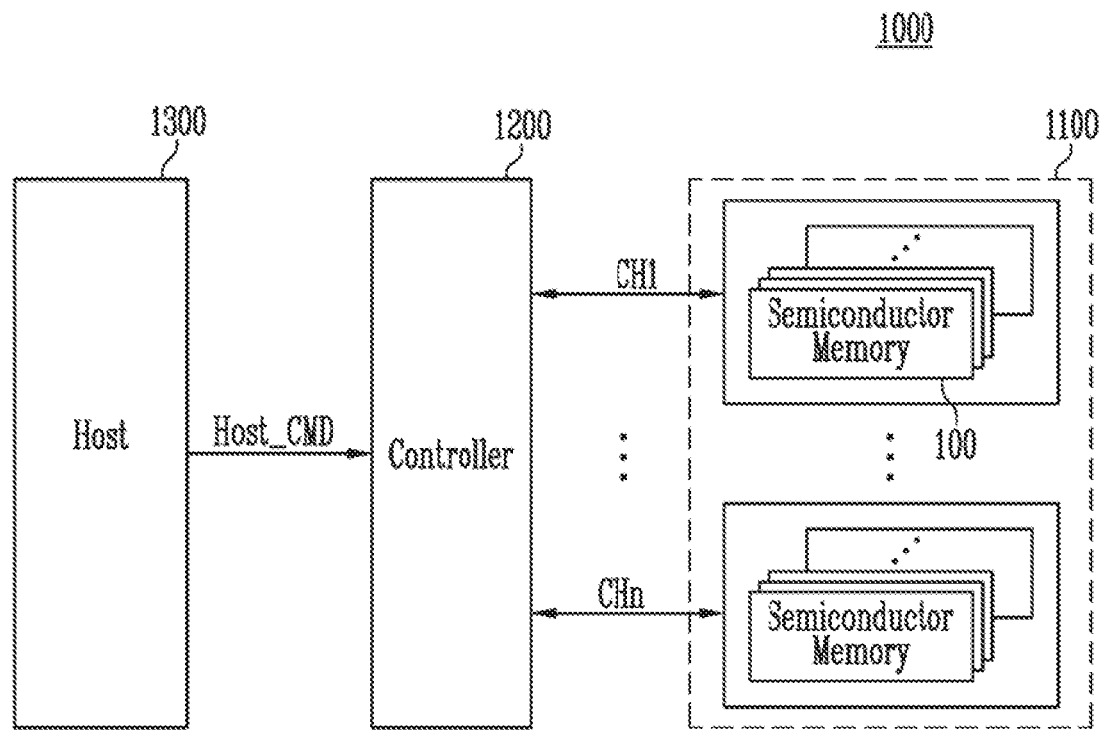
FIG. 1 is a block diagram for describing a memory system according to an embodiment of the present disclosure.

Specific structural or functional descriptions of embodiments according to the concepts which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Since various modifications and changes may be applied to the embodiment according to the concept of the present disclosure and the embodiment according to the concept of the present disclosure may have various forms, the specific embodiments will be illustrated in the drawings and described in the present specification or application. However, it should be understood that the embodiments according to the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope according to the concept of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "~ between," "immediately~ between" or "adjacent to~", "directly adjacent to~", and the like should be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in the present specification, should not be construed as having idealistic or excessively formal meanings.

In describing an embodiment, description of technical contents which are well known in the technical field of the present disclosure and are not directly related to the present disclosure will be omitted. This intends to disclose the gist of the present disclosure more clearly by omitting unnecessary description.

Hereinafter, embodiments of the present disclosure will be described with reference to the accompanying drawings, so that those skilled in the art to which the present disclosure pertains may easily carry out the technical spirit of the present disclosure.

An embodiment of the present disclosure provides a memory system and a method of operating the memory system which determine a reliability level of a memory device by monitoring a threshold voltage distribution of memory cells and set performance parameters of the memory system based on the determined reliability level.

The present technology may monitor the threshold voltage distribution of the memory cells after performing the test program and test erase operation and determine a reliability level of the semiconductor memories based on the monitoring results. In addition, the present technology may improve reliability and lifetime of the memory system by adjusting the performance parameters of the memory system based on the reliability level of the semiconductor memories.

FIG. 1 is a block diagram illustrating a memory system according to an embodiment of the present disclosure.

Referring to FIG. 1, the memory system 1000 includes a memory device 1100, a controller 1200, and a host 1300. The memory device 1100 includes a plurality of semiconductor memories 100. The plurality of semiconductor memories 100 may be divided into a plurality of groups. Although the host 1300 is illustrated and described as being included in the memory system 1000 in the embodiment of the present disclosure, the memory system 1000 may be configured to include only the controller 1200 and the memory device 1100, and the host may be configured to be disposed outside the memory system 1000.

In FIG. 1, the plurality of groups of the memory device 1100 communicate with the controller 1200 through first to n-th channels CH1 to CHn, respectively. Each semiconductor memory 100 will be described later with reference to FIG. 3.

Each of the plurality of groups configured of the semiconductor memories 100 is configured to communicate with the controller 1200 through one common channel. The controller 1200 is configured to control the plurality of semiconductor memories 100 of the memory device 1100 through the plurality of channels CH1 to CHn.

The controller 1200 is connected between the host 1300 and the memory device 1100. The controller 1200 is configured to access the memory device 1100 in response to a request from the host 1300. For example, the controller 1200 is configured to control read, write, erase, and background operations of the memory device 1100 in response to a host command Host_CMD received from the host 1300. During the write operation, the host 1300 may transmit data and an address together with the host command Host_CMD. During the read operation, the host 1300 may transmit an address together with the host command Host_CMD. The controller 1200 is configured to provide an interface between the memory device 1100 and the host 1300. The controller 1200 is configured to drive firmware for controlling the memory device 1100.

The controller 1200 according to an embodiment of the present disclosure may control the memory device 1100 to perform a test program operation and a test erase operation for the plurality of semiconductor memories 100 in response to a test operation request of the host 1300. In addition, the memory device 1100 is controlled to perform a first threshold voltage distribution monitoring operation after the test program operation and to perform a second threshold voltage distribution monitoring operation after the test erase operation, to determine a reliability level of the plurality of memory blocks included in each of the plurality of semiconductor memories. The controller 1200 may set and reset an operation performance parameter of the plurality of memory blocks included in each of the plurality of semiconductor memories 100 based on the determined reliability level. For example, the controller 1200 may classify each of the plurality of memory blocks 11 included in each of the plurality of semiconductor memories 100 based on a result of the first threshold voltage distribution monitoring operation and a result of the second threshold voltage distribution monitoring operation into at least two reliability classes, and may set and reset the operation performance parameters of each of the plurality of memory blocks 11 based on the classified reliability class. The operation performance parameter may include a garbage collection operation cycle, threshold voltage distribution positions corresponding to each program state, a maximum erase count specification, a read reclaim cycle, the number of read voltages used during a read retry operation, and the like of a corresponding memory block. For example, when the reliability level is a high class, the garbage collection operation cycle, the maximum erase count specification, and the read reclaim cycle may be increased and the number of the read voltages used during the read retry operation may be reduced. In addition, when the reliability level is a low class, the garbage collection operation cycle, the maximum erase count specification, and the read reclaim cycle may be reduced, the number of the read voltages used during the read retry operation may be reduced, a threshold voltage distribution of a program state having a relatively high threshold voltage distribution among the plurality of program states may be increased, and a threshold voltage distribution of a program state having a relatively low threshold voltage distribution may be reduced.

The controller 1200 according to another embodiment of the present disclosure reads content addressable memory (cam) data stored in each of the plurality of semiconductor memories 100 of the memory device 1100 during a power-on operation of the memory system 1000, and determines the reliability level of each of the plurality of semiconductor memories 100 based on threshold voltage distribution monitoring information included in the read cam data. The controller 1200 may set and reset the operation performance parameters of the plurality of semiconductor memories 100 based on the determined reliability level. The operation performance parameter may include a garbage collection operation cycle, threshold voltage distribution positions corresponding to each program state, a maximum erase count specification, a read reclaim cycle, the number of read voltages used during a read retry operation, and the like of a corresponding memory block. Each of the plurality of semiconductor memories 100 performs the test program operation and the test erase operation at a wafer level before being packaged into the memory system 1000. Each of the plurality of semiconductor memories 100 performs the first threshold voltage distribution monitoring operation after the test program operation, performs the second threshold voltage distribution monitoring operation after the test erasure operation to generate the threshold voltage distribution monitoring information, and stores the generated monitoring information in a cam block of a corresponding semiconductor memory 100.

The host 1300 includes a portable electronic device such as a computer, a PDA, a PMP, an MP3 player, a camera, a camcorder, or a mobile phone. The host 1300 may request a write operation, a read operation, an erase operation, or the like of the memory system 1000 through the host command Host_CMD. The host 1300 may transmit a host command Host_CMD, data, and an address corresponding to a write command to the controller 1200 for the write operation of the memory device 1100 and may transmit a host command Host_CMD and an address corresponding to a read command for the read operation to the controller 1200. At this time, the address may be a logical address.

The controller 1200 and the memory device 1100 may be integrated into one semiconductor device. As an example of an embodiment, the controller 1200 and the memory device 1100 may be integrated into a one semiconductor device to configure a memory card. For example, the controller 1200 and the memory device 1100 may be integrated into a one semiconductor device to configure a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash stage device (UFS).

The controller 1200 and the memory device 1100 may be integrated into a one semiconductor device to configure a solid state drive (SSD). The semiconductor drive (SSD) includes a storage device configured to store data in the semiconductor memory 100.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), or a wafer-level processed stack package (WSP).

Figure 2:
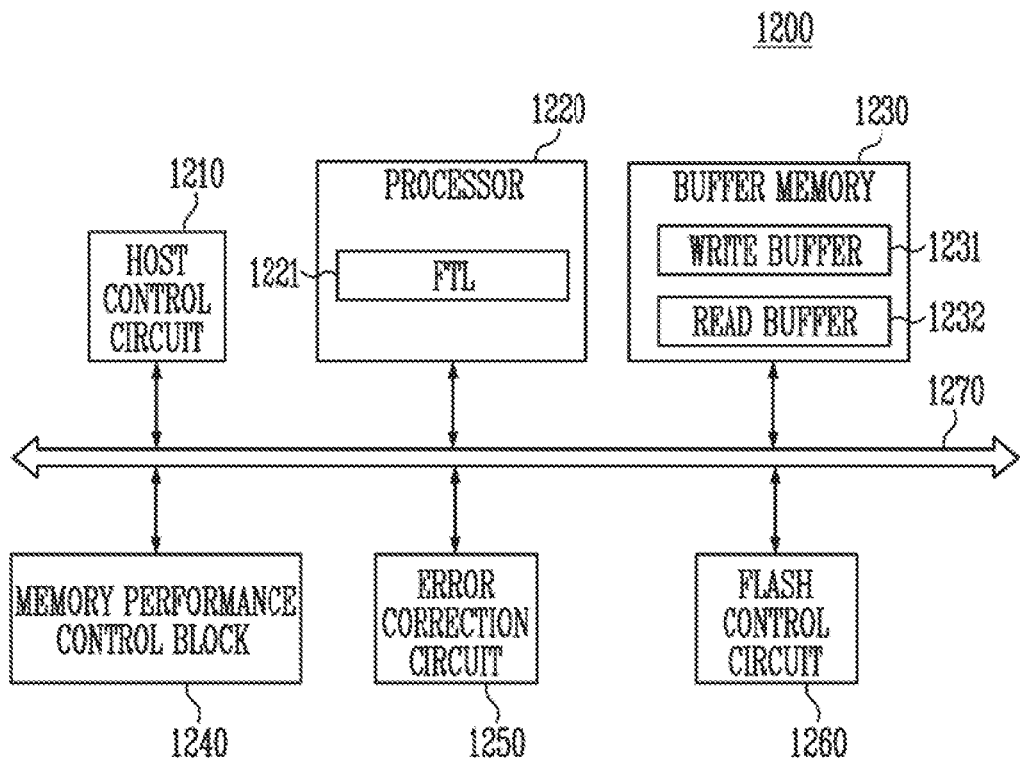
FIG. 2 is a block diagram for describing a configuration of a controller of FIG. 1.

FIG. 2 is a diagram for describing the controller of FIG. 1.

Referring to FIG. 2, the controller 1200 may include a host control circuit 1210, a processor 1220, a buffer memory 1230, a memory performance control block 1240, an error correction circuit 1250, a flash control circuit 1260, and a bus 1270.

The bus 1270 may be configured to provide a channel between components of the controller 1200.

The host control circuit 1210 may control data transmission between the host 1300 of FIG. 1 and the buffer memory 1230. As an example, the host control circuit 1210 may control an operation of buffering data input from the host 1300 to the buffer memory 1230. As another example, the host control circuit 1210 may control an operation of outputting data buffered in the buffer memory 1230 to the host 1300.

The host control circuit 1210 may be configured to include a host interface.

The processor 1220 may control all operations of the controller 1200 and perform a logical operation. The processor 1220 may communicate with the host 1300 of FIG. 1 through the host control circuit 1210 and may communicate with the memory device 1100 of FIG. 1 through the flash control circuit 1260. In addition, the processor 1220 may control the operation of the memory system 1000 using the buffer memory 1230 as an operation memory, a cache memory, or a buffer. The processor 1220 may rearrange a plurality of host commands received from the host 1300 in priority order to control the flash control circuit 1260 by generating a command queue. The processor 1220 may include a flash translation layer (hereinafter, referred to as 'FTL') 1221.

The flash translation layer 1221 may store firmware in a buffer memory 1230, an additional memory (not shown) directly connected to the processor 1220, or a storage space in the processor 1220. The flash layer 1221 may map a physical address corresponding to the address (for example, the logical address) input from the host 1300 of FIG. 1 during the write operation. In addition, the flash translation layer 1221 checks the physical address mapped to the logical address input from the host 1300 during the read operation.

The flash translation layer 1221 may control the flash control circuit 1260 to cause the memory device 1100 of FIG. 1 to sequentially perform the test program operation, the first threshold voltage distribution monitoring operation, the test erase operation, and the second threshold voltage distribution monitoring operation, in response to the host command corresponding to the test operation, which is received from the host 1300.

The buffer memory 1230 may be used as an operation memory, a cache memory, or a buffer of the processor 1220. The buffer memory 1230 may store codes and commands executed by the processor 1220. The buffer memory 1230 may store data that is processed by the processor 1220.

The buffer memory 1230 may include a write buffer 1231 and a read buffer 1232. The write buffer 1231 temporarily stores the data received from the host 1300 during the write operation and transmits the temporarily stored data to the memory device 1100 when an internal command corresponding to the write operation is transmitted to the memory device 1100. The read buffer 1232 temporarily stores data received from the memory device 1100 during the read operation, and then transmits the temporarily stored data to the host 1300.

The buffer memory 1230 may include a static RAM (SRAM) or a dynamic RAM (DRAM).

The memory performance control block 1240 sets and resets the operation performance parameters of the plurality of memory blocks included in the memory device 1100 based on the result of the first threshold voltage distribution monitoring operation and the result of the second threshold voltage distribution monitoring operation of the memory device 1100 of FIG. 1. That is, the memory performance control block 1240 may determine and classify the reliability levels of each memory block into any one class based on the result of the first and second threshold voltage distribution monitoring operations, and may set and reset the operation performance parameters of each of the plurality of memory blocks 11 based on the classified reliability class. The operation performance parameter may include a garbage collection operation cycle, threshold voltage distribution positions corresponding to each program state, a maximum erase count specification, a read reclaim cycle, the number of read voltages used during a read retry operation, and the like of a corresponding memory block. The set or reset operation performance parameter of the memory block is preferably utilized during all operations of the memory block. That is, it is preferable that the processor 1220 checks the operation performance parameter of a corresponding memory block during all operations of the corresponding memory block and controls all operations of the corresponding memory block based on the operation performance parameter. For example, the processor 1220 may control garbage collection and a read reclaim operation of a corresponding memory block based on the operation performance parameter. The processor 1220 may adjust a program verify level based on a threshold voltage distribution corresponding to the program state during the program operation of the corresponding memory block, set the number of read retry voltages during the read operation, and adjust a maximum erase count number of the corresponding memory block, to determine whether or not to process a bad block.

As another embodiment, the memory performance control block 1240 may receive the read cam data from the memory device 1100 during the power-on operation of the memory system 1000, determine and classify the reliability levels of each of the plurality of semiconductor memories 100 of FIG. 1 included in the memory device 1100 as any one class among a plurality of reliability classes based on the threshold voltage distribution monitoring information included in the received cam data, and may set and reset the operation performance parameters of each of the plurality of memory blocks 11 based on the classified reliability class. The operation performance parameter may include a garbage collection operation cycle, threshold voltage distribution positions corresponding to each program state, a maximum erase count specification, a read reclaim cycle, the number of read voltages used during a read retry operation, and the like of a corresponding memory block. It is preferable that the set or reset operation performance parameter of the semiconductor memory is utilized during all operations of a corresponding semiconductor memory. That is, it is preferable that the processor 1220 checks the operation performance parameter of a corresponding semiconductor memory during all operations of the corresponding semiconductor memory and controls all operations of the corresponding semiconductor memory based on the operation performance parameter. For example, the processor 1220 may control garbage collection and a read reclaim operation of a plurality of memory blocks included in a corresponding semiconductor memory based on the operation performance parameter. The processor 1220 may adjust a program verify level based on a threshold voltage distribution corresponding to the program state during the program operation of the corresponding memory block, set the number of read retry voltages during the read operation, and adjust a maximum erase count number of the corresponding memory blocks included in the corresponding semiconductor memory, to determine whether or not to process a bad block.

As an example, the memory performance control block 1240 may be included in the processor 1220 as a component of the processor 1220.

The error correction circuit 1250 may perform error correction. The error correction circuit 1250 may perform error correction encoding (ECC encoding) based on data to be written to the memory device 1100 of FIG. 1 through the flash control circuit 1260. The error correction encoded data may be transferred to the memory device 1100 through the flash control circuitry 1260. The error correction circuit 1250 may perform error correction decoding (ECC decoding) on the data received from the memory device 1100 through the flash control circuit 1260. The error correction circuit 1250 may be configured as one of a plurality of error correction code (ECC) circuits, and the plurality of ECC circuits may have different error correction capabilities. That is, each of the plurality of ECC circuits has a different maximum error allowable bit number. In addition, the error correction circuit 1250 may detect and count an error bit of the data received from the memory device 1100 during the read operation and may transmit the number of the counted error bits to the processor 1220.

As an example, the error correction circuit 1250 may be included in the flash control circuit 1260 as a component of the flash control circuit 1260.

The flash control circuit 1260 generates and outputs an internal command for controlling the memory device 1100 in response to the command queue generated by the processor 1220. The flash control circuit 1260 may control the write operation by transmitting the data buffered to the write buffer 1231 of the buffer memory 1230 to the memory device 1100 during the write operation. As another example, the flash control circuit 1260 may control the operation of buffering the data read from the memory device 1100 to the read buffer 1232 of the buffer memory 1230 in response to the command queue during the read operation. As another example, the flash control circuit 1260 may control the memory device 1100 to perform the test program, the first threshold voltage distribution monitoring operation, the test erase operation, and the second threshold voltage distribution monitoring operation in response to the command queue during the test operation, and may receive the results of the first threshold voltage distribution monitoring operation and the second threshold voltage distribution monitoring operation from the memory device 1100 to transmit the results of the first threshold voltage distribution monitoring operation and the second threshold voltage distribution monitoring operation to the memory performance control block 1240.

The flash control circuit 1260 may include a flash interface.

Figure 3:
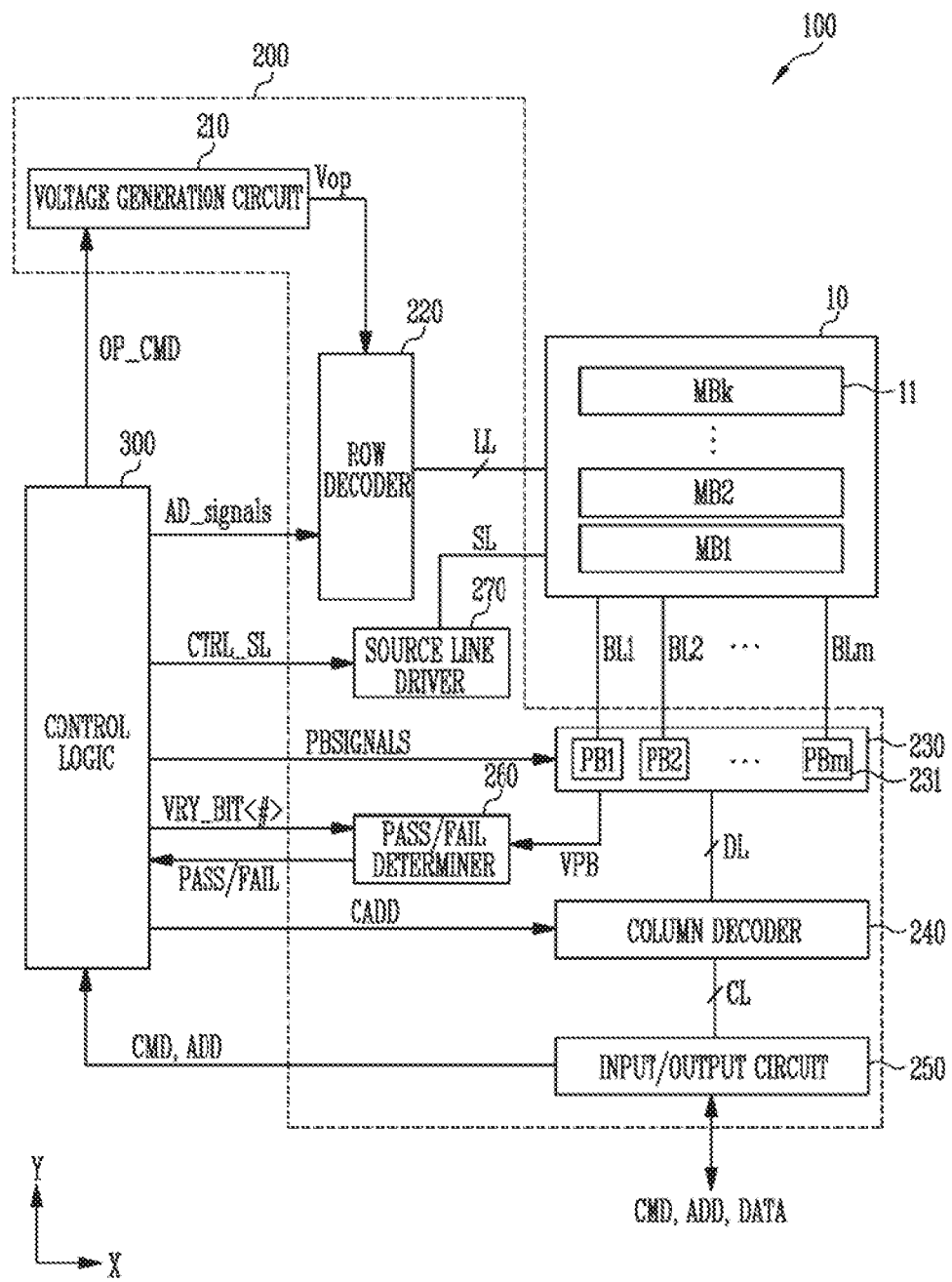
FIG. 3 is a diagram for describing a semiconductor memory of FIG. 1.

FIG. 3 is a diagram for describing the semiconductor memory 100 of FIG. 1.

Referring to FIG. 3, the semiconductor memory 100 may include a memory cell array 10 in which data is stored. The semiconductor memory 100 may include peripheral circuits 200 configured to perform a program operation for storing data in the memory cell array 10, a read operation for outputting the stored data, and an erase operation for erasing the stored data. The semiconductor memory 100 may include control logic 300 that controls the peripheral circuits 200 according to control of the controller 1200 of FIG. 1. The control logic 300 may be implemented as hardware, software, or a combination of hardware and software. For example, the control logic 300 may be a control logic circuit operating in accordance with an algorithm and/or a processor executing control logic code.

The memory cell array 10 may include memory blocks MB1 to MBk and 11 (k is a positive integer). Local lines LL and bit lines BL1 to BLm (m is a positive integer) may be connected to each of the memory blocks MB1 to MBk and 11. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk and 11, respectively, and the bit lines BL1 to BLm may be commonly connected to the memory blocks MB1 to MBk and 11. The memory blocks MB1 to MBk and 11 may be implemented in a two-dimensional or three-dimensional structure. For example, the memory cells may be arranged in a direction parallel to a substrate in the memory block 11 of the two-dimensional structure. For example, the memory cells may be stacked in a direction perpendicular to the substrate in the memory block 11 of the three-dimensional structure. In an embodiment of the present disclosure, at least any one memory block (for example, MB1) of a plurality of memory blocks MB1 to MBk and 11 may be defined as a content addressable memory (CAM) block, the CAM block may store cam data including threshold voltage distribution monitoring information obtained as the results of the first and second threshold voltage distribution monitoring operations which are performed after the test program operation and the test erase operation of the semiconductor memory.

The peripheral circuits 200 may be configured to perform the program, read, and erase operations of the selected memory block 11 under control of the control logic 300. In addition, the peripheral circuits 200 may be configured to perform the first and second threshold voltage distribution monitoring operations of the selected memory block 11 under the control of the control logic 300. For example, the peripheral circuits 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, erase, and threshold voltage monitoring operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a pass voltage, a monitoring read voltage, and a select transistor operation voltage under the control of the control logic 300.

The row decoder 220 may transfer the operation voltages Vop to the local lines LL connected to the selected memory block 11 in response to control signals AD_signals. For example, the row decoder 220 may selectively apply the operation voltages (for example, the program voltage, the verify voltage, the pass voltage, the monitoring read voltage, and the like) generated in the voltage generation circuit 210 in response to the control signals AD_signals to the word lines among the local lines LL.

The row decoder 220 applies the program voltage generated in the voltage generation circuit 210 to the selected word line among the local lines LL and applies the pass voltage generated in the voltage generation circuit 210 to the remaining unselected word lines, in response to the control signals AD_signals during a program voltage application operation. In addition, the row decoder 220 applies the read voltage generated in the voltage generation circuit 210 to the selected word line among the local lines LL and applies the pass voltage generated in the voltage generation circuit 210 to the remaining unselected word lines, in response to the control signals AD_signals during the read operation. In addition, the row decoder 220 applies the monitoring read voltage generated in the voltage generation circuit 210 to the selected word line among the local lines LL and applies the pass voltage generated in the voltage generation circuit 210 to the remaining unselected word lines, in response to the control signals AD_signals during the threshold voltage monitoring operation.

The page buffer group 230 may include a plurality of page buffers PB1 to PBm and 231 connected to the bit lines BL1 to BLm. The page buffers PB1 to PBm and 231 may operate in response to page buffer control signals PBSIGNALS. For example, the page buffers PB1 to PBm and 231 may temporarily store data to be programmed during the program operation or sense a voltage or a current of the bit lines BL1 to BLm during the read operation, the verify operation, or the threshold voltage monitoring operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer an internal command CMD and an address ADD received from the controller 1200 of FIG. 1 to the control logic 300 or may exchange the data DATA with the column decoder 240.

The pass/fail determiner 260 may generate a reference current in response to a permission bit VRY_BIT<#> during the read operation, compare a sensing voltage VPB received from the page buffer group 230 with a reference voltage generated by the reference current, and output a pass signal PASS or a fail signal FAIL.

The source line driver 270 may be connected to the memory cell included in the memory cell array 10 through the source line SL and may control a voltage applied to the source line SL. The source line driver 270 may receive a source line control signal CTRL_SL from the control logic 300 and may control a source line voltage applied to the source line SL based on the source line control signal CTRL_SL.

The control logic 300 may output the operation signal OP_CMD, the control signals AD_signals, the page buffer control signals PBSIGNALS, and the permission bit VRY_BIT<#> in response to the internal command CMD and the address ADD to control the peripheral circuits 200. In addition, the control logic 300 may determine whether the verify operation is passed or failed in response to the pass signal PASS or the fail signal FAIL.

Figure 4:
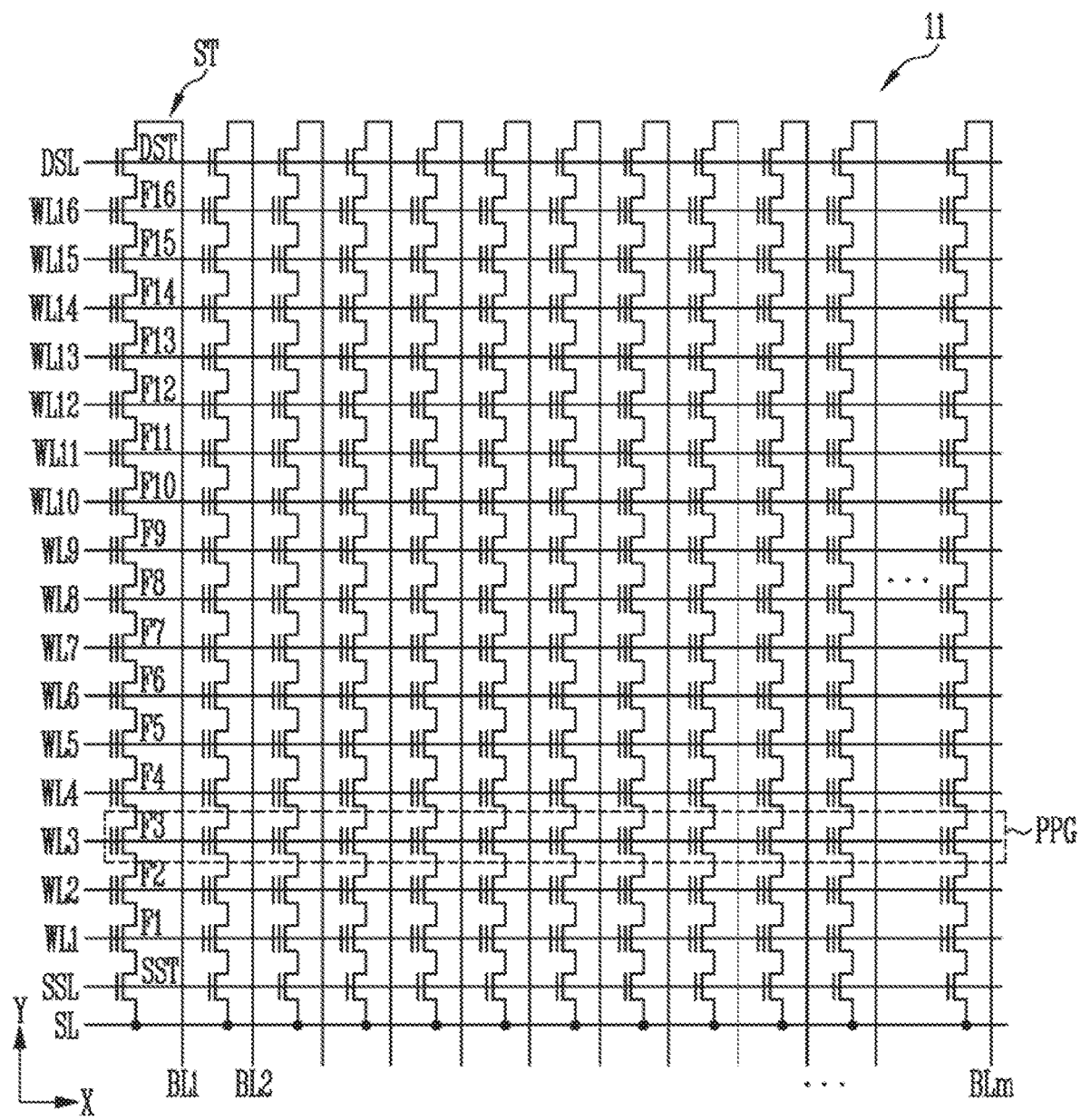
FIG. 4 is a diagram for describing a memory block of FIG. 3.

FIG. 4 is a diagram for describing the memory block of FIG. 3.

Referring to FIG. 4, the memory block 11 may be connected to a plurality of word lines WL1 to WL16 arranged in parallel with each other between the first select line and the second select line. Here, the first select line may be the source select line SSL, and the second select line may be the drain select line DSL. For example, the memory block 11 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the figure.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to the plurality of word lines WL1 to WL16. A group of the memory cells connected to the same word line among the memory cells included in different strings ST may be referred to as a physical page PPG. Therefore, the memory block 11 may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells included in one physical page PPG. In addition, one memory cell may store two or more bits of data. This is commonly referred to as a multi-level cell (MLC). In this case, one physical page PPG may store two or more logical page (LPG) data.

Figure 5:
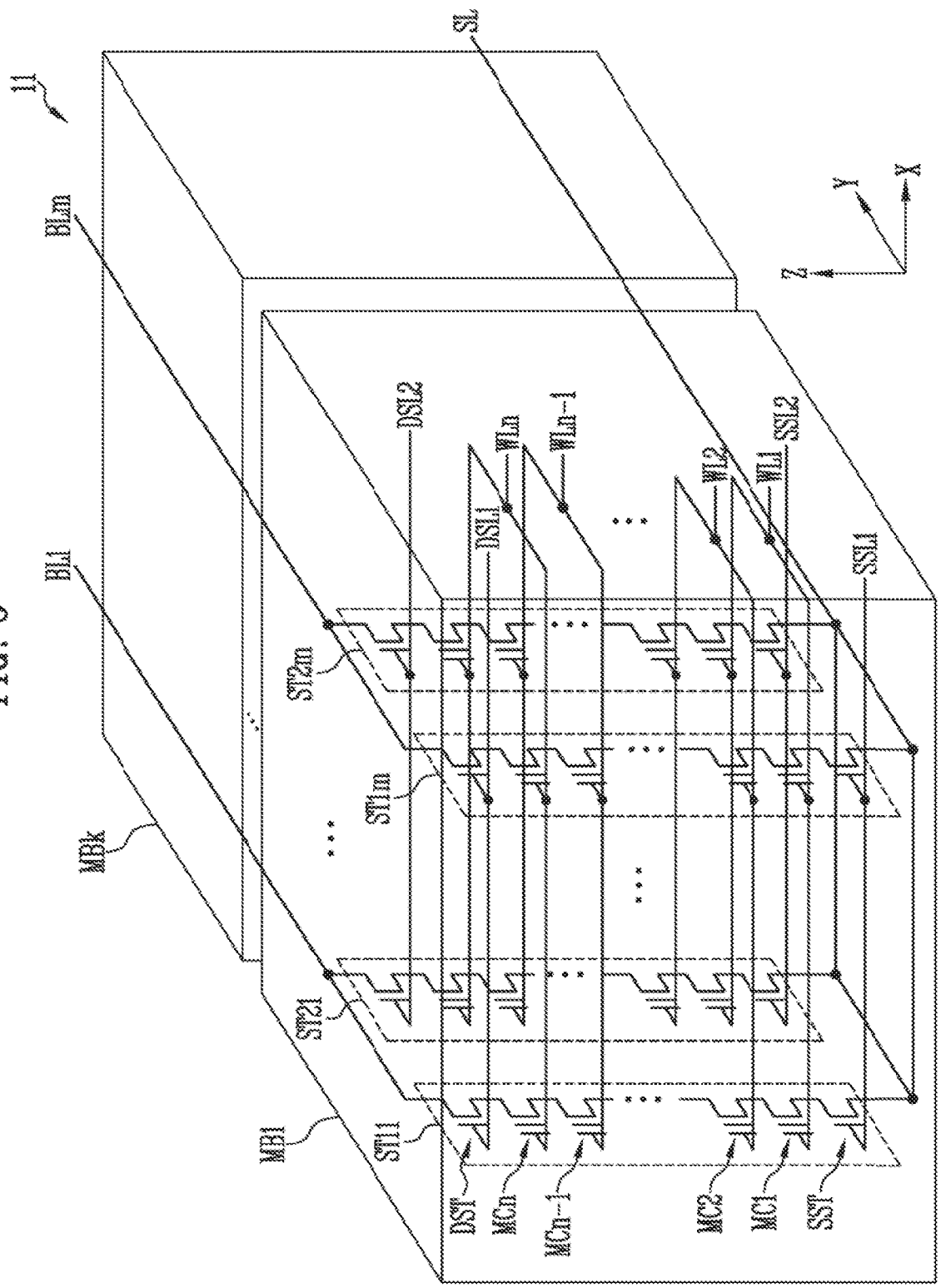
FIG. 5 is a diagram for describing an embodiment of a memory block configured in a three-dimension.

FIG. 5 is a diagram for describing an embodiment of a memory block configured in a three-dimension.

Referring to FIG. 5, the memory cell array 10 may include a plurality of memory blocks MB1 to MBk and 11. The memory block 11 may include a plurality of strings ST11 to ST1m and ST21 to ST2m. Each of the plurality of strings ST11 to ST1m and ST21 to ST2m may extend along a vertical direction (Z direction). In the memory block 11, m strings may be arranged in a row direction (X direction). In FIG. 5, two strings are arranged in a column direction (Y direction), but this is for convenience of description, and three or more strings may be arranged in the column direction (Y direction).

Each of the plurality of strings ST11 to ST1m and ST21 to ST2m may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11 to ST1m arranged in the first row may be connected to a first source select line SSL1. The source select transistors of the strings ST21 to ST2m arranged in the second row may be connected to a second source select line SSL2. As another embodiment, the source select transistors of the strings ST11 to ST1m and ST21 to ST2m may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11 to ST1m of the first row may be connected to a first drain select line DSL1. The drain select transistors DST of the strings ST21 to ST2m of the second row may be connected to a second drain select line DSL2.

Figure 6:
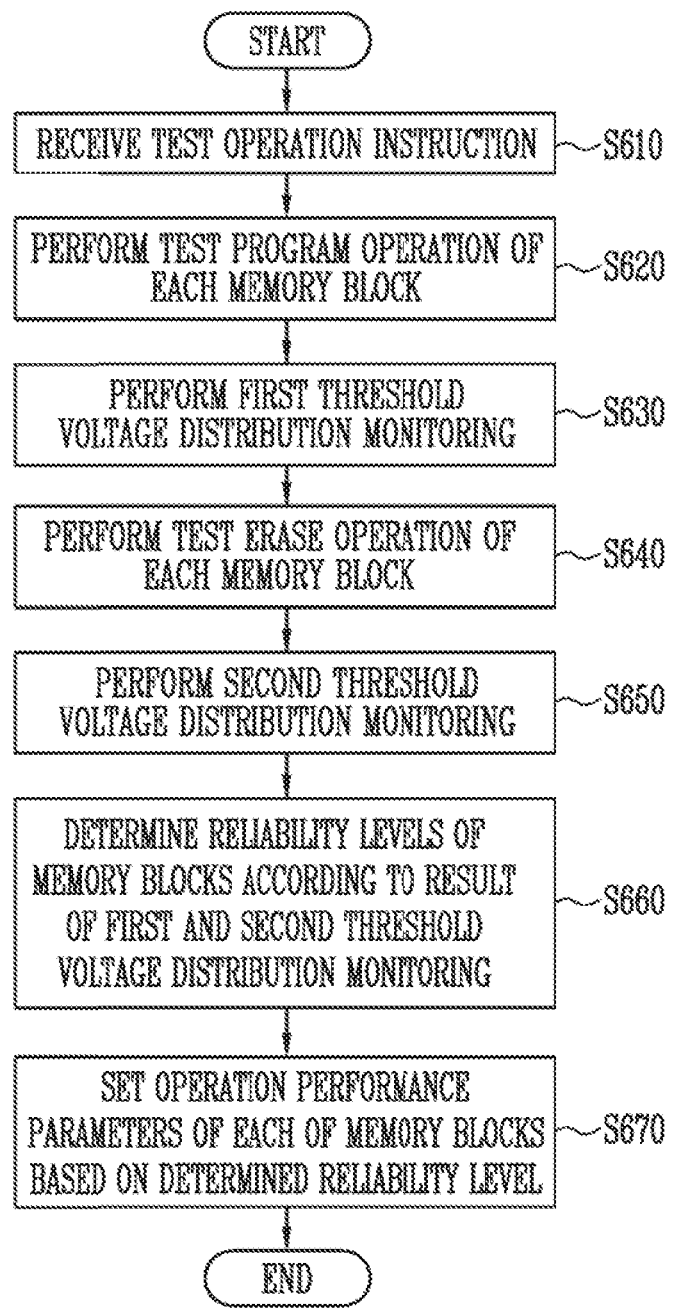
FIG. 6 is a flowchart for describing an operation of a memory system according to an embodiment of the present disclosure.

FIG. 6 is a flowchart for describing an operation of a memory system according to an embodiment of the present disclosure.

Figure 7:
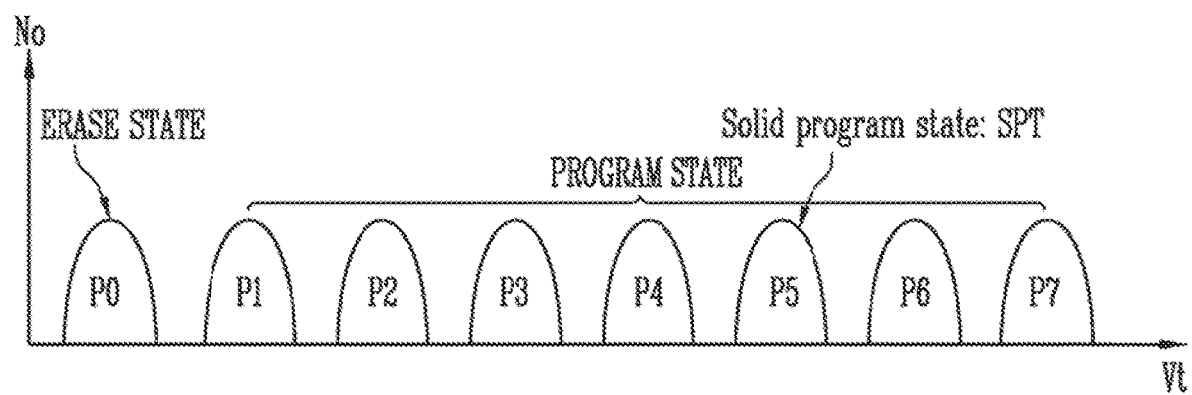
FIG. 7 is a threshold voltage distribution diagram for describing a threshold voltage distribution of memory cells.

FIG. 7 is a threshold voltage distribution diagram for describing a threshold voltage distribution of memory cells.

Figure 8:
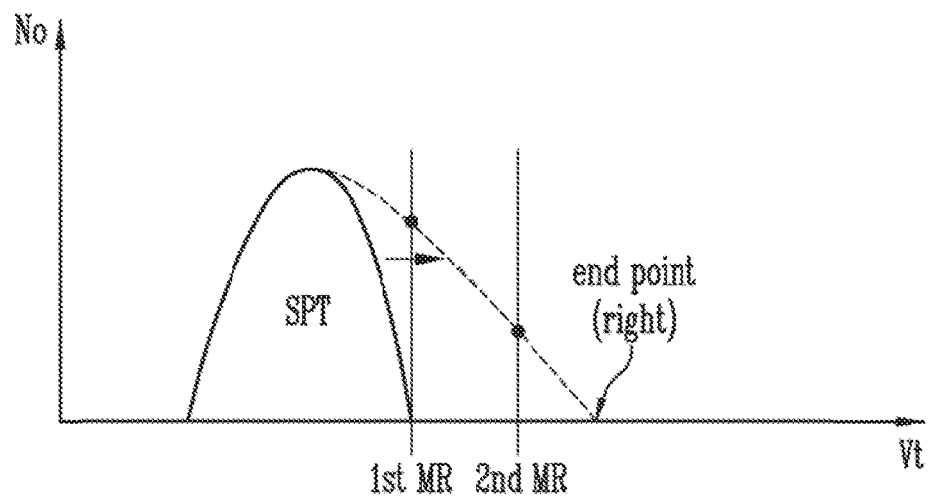
FIG. 8 is a threshold voltage distribution diagram for describing a first threshold voltage distribution monitoring operation according to an embodiment of the present disclosure.

FIG. 8 is a threshold voltage distribution diagram for describing a first threshold voltage distribution monitoring operation according to an embodiment of the present disclosure.

Figure 9:
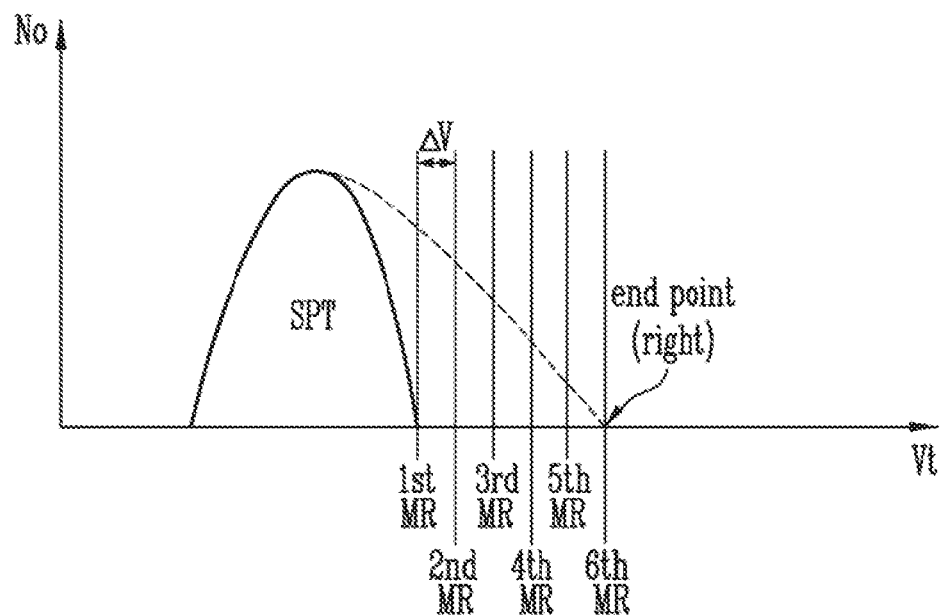
FIG. 9 is a threshold voltage distribution diagram for describing a first threshold voltage distribution monitoring operation according to another embodiment of the present disclosure.

FIG. 9 is a threshold voltage distribution diagram for describing a first threshold voltage distribution monitoring operation according to another embodiment of the present disclosure.

Figure 10:
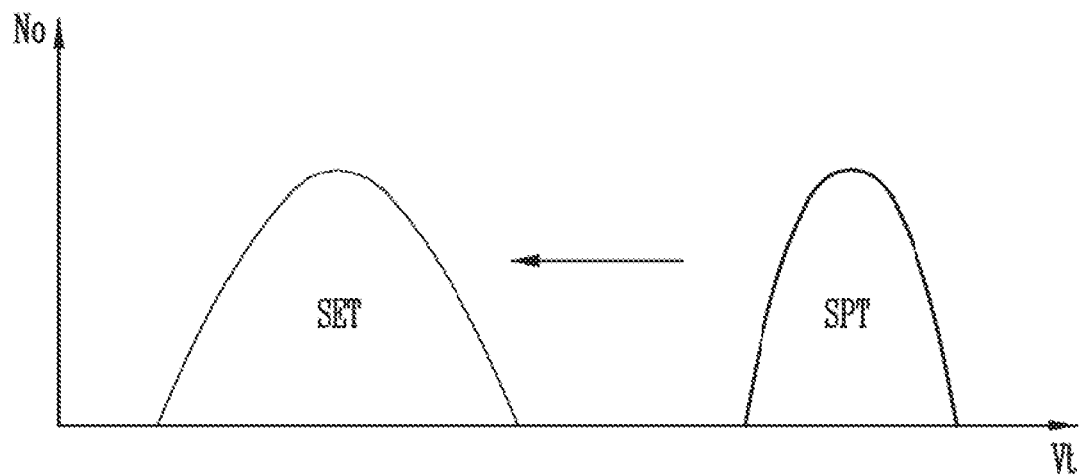
FIG. 10 is a threshold voltage distribution diagram for describing a test erase operation for memory cells programmed to a solid program state.

FIG. 10 is a threshold voltage distribution diagram for describing a test erase operation for memory cells programmed to a solid program state.

Figure 11:
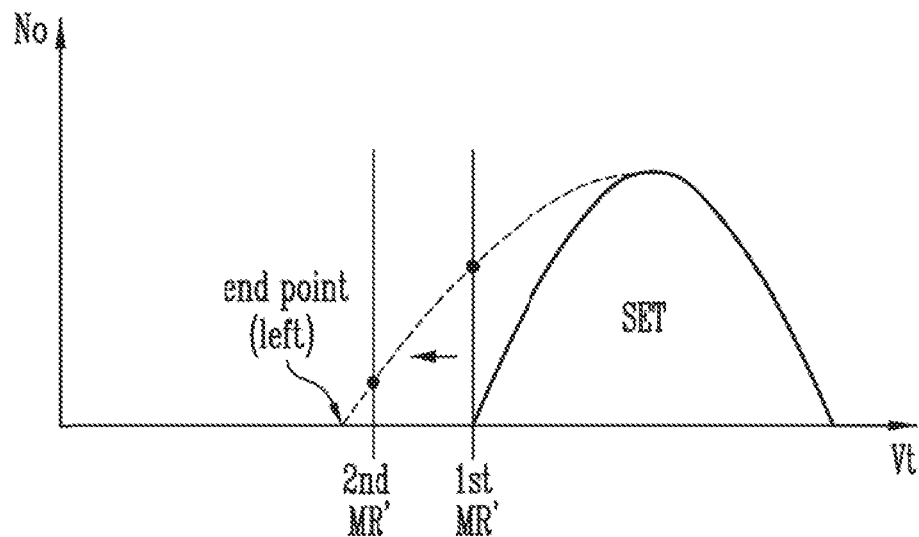
FIG. 11 is a threshold voltage distribution diagram for describing a second threshold voltage distribution monitoring operation according to an embodiment of the present disclosure.

FIG. 11 is a threshold voltage distribution diagram for describing a second threshold voltage distribution monitoring operation according to an embodiment of the present disclosure.

Figure 12:
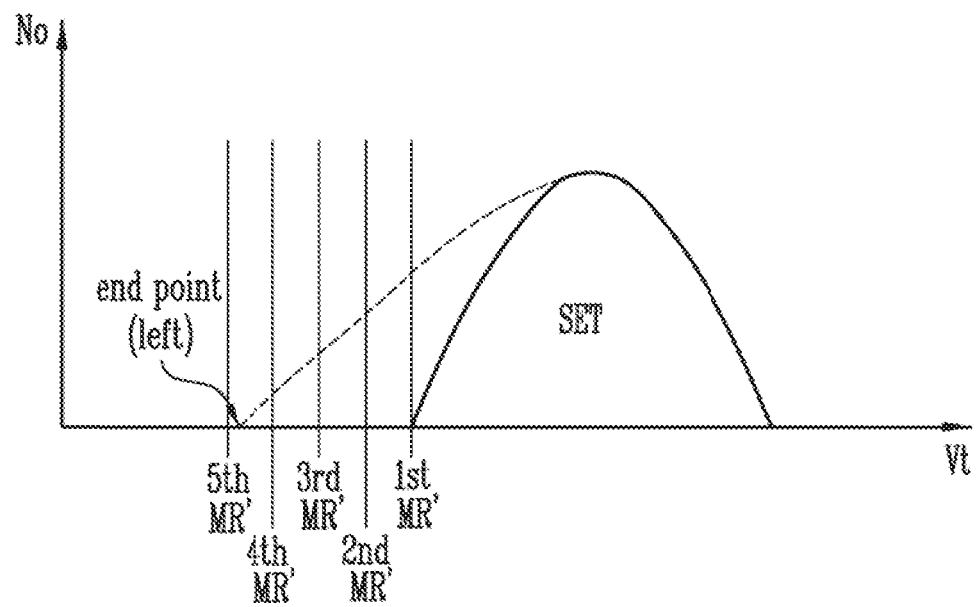
FIG. 12 is a threshold voltage distribution diagram for describing a second threshold voltage distribution monitoring operation according to another embodiment of the present disclosure.

FIG. 12 is a threshold voltage distribution diagram for describing a second threshold voltage distribution monitoring operation according to another embodiment of the present disclosure.

The operation of the memory system according to an embodiment of the present disclosure will be described with reference to FIGS. 1 to 12 as follows.

When the host command Host_CMD corresponding to the test operation is received from the host 1300 to the controller 1200 (S610), the processor 1220 of the controller 1200 generates the command queue corresponding to the test operation. It is preferable that the command queue is queued for a command corresponding to the test program operation, the first threshold voltage distribution monitoring operation, the test erase operation, and the second threshold voltage distribution monitoring operation during the test operation. The flash control circuit 1260 generates and outputs the internal command CMD for controlling the test operation of the memory device 1100 in response to the command queue generated by the processor 1220.

Each of the plurality of semiconductor memories 100 of the memory device 1100 performs the test program operation in response to the internal command CMD (S620).

In an embodiment of the present disclosure, a case where the semiconductor memories 100 are programmable by a triple level cell (TLC) method will be described as an example. The triple level cell (TLC) method may program the memory cells to have a threshold voltage distribution of an erase state P0 and a plurality of program states P1 to P7 as shown in FIG. 7.

Each of the plurality of semiconductor memories 100 defines any one program state of the plurality of program states P1 to P7 as a solid program state SPT. In an embodiment of the present disclosure, the program state P5 is defined as the solid program state SPT. During the test program operation, each of the plurality of semiconductor memory 100 programs the memory cells included in the plurality of memory blocks MB1 to MBk to the solid program state SPT. That is, each of all of the semiconductor memories 100 included in the memory device 1100 programs the memory cells included in all of the memory blocks MB1 to MBk to the solid program state SPT.

Each of the plurality of semiconductor memories 100 of the memory device 1100 performs the first threshold voltage distribution monitoring operation after the test program operation in response to the internal command CMD (S630).

After the memory cells included in the semiconductor memory 100 are programmed to the solid program state SPT, a threshold voltage of some of the memory cells may increase as shown in FIG. 8. Such memory cells may be read in a different program state during the read operation, and thus reliability of the semiconductor memory 100 may be reduced. The first threshold voltage distribution monitoring operation is an operation of checking memory cells having a threshold voltage higher than a threshold voltage distribution of a normal solid program state SPT after the test program operation (S620).

The first threshold voltage distribution monitoring operation according to an embodiment of the present disclosure will be described with reference to FIGS. 3 and 8 as follows.

First a first threshold voltage distribution monitoring operation for the selected physical page PPG is performed. The voltage generation circuit 210 generates a first monitoring read voltage 1st MR and the pass voltage in response to the operation signal OP_CMD, and the row decoder 220 applies the first monitoring read voltage 1st MR to the selected word line of the selected memory block and applies the pass voltage to the remaining unselected word lines. The first monitoring read voltage 1st MR is preferably the same voltage as the highest threshold voltage of the normal solid program state SPT. The page buffer group 230 detects memory cells having a threshold voltage higher than the first monitoring read voltage 1st MR among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage higher than the first monitoring read voltage 1st MR using the sensing voltage VPB. In an embodiment, the page buffer group 230 detects memory cells having a threshold voltage higher than a normal threshold voltage range among the memory cells (i.e., using the first monitoring read voltage 1st MR as a voltage that is the highest threshold voltage of the normal solid program state SPT) included in one physical page PPG corresponding to the selected word line by sensing a potential level or a current amount of the bit lines BL1 to BLm, and generates the sensing voltage VPB corresponding to the number of the detected memory cells.

Thereafter, the first threshold voltage distribution monitoring operation described above is performed on the next physical page PPG.

The first threshold voltage distribution monitoring operation for all of the physical pages included in the memory block is performed in the method described above to detect the memory cells having the threshold voltage higher than the first monitoring read voltage 1st MR among the plurality of memory cells included in the selected memory block.

The first threshold voltage distribution monitoring operation described above may be performed on all of the memory blocks 11 included in the semiconductor memory 100, and information on the number of the detected memory cells of each of the memory blocks 11 may be output to the controller 1200.

The first threshold voltage distribution monitoring operation according to another embodiment of the present disclosure will be described with reference to FIGS. 3 and 8 as follows.

A first threshold voltage distribution monitoring operation for the selected physical page PPG is performed. The voltage generation circuit 210 generates a first monitoring read voltage 1st MR and the pass voltage in response to the operation signal OP_CMD, and the row decoder 220 applies the first monitoring read voltage 1st MR to the selected word line of the selected memory block and applies the pass voltage to the remaining unselected word lines. The first monitoring read voltage 1st MR is preferably the same voltage as the highest threshold voltage of the normal solid program state SPT. The page buffer group 230 detects memory cells having a threshold voltage higher than the first monitoring read voltage 1st MR among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage higher than the first monitoring read voltage 1st MR using the sensing voltage VPB.

Thereafter, the voltage generation circuit 210 generates a second monitoring read voltage 2nd MR and the pass voltage in response to the operation signal OP_CMD, and the row decoder 220 applies the second monitoring read voltage 2nd MR to the selected word line of the selected memory block and applies the pass voltage to the remaining unselected word lines. The second monitoring read voltage 2nd MR is preferably higher than the first monitoring read voltage 1st MR. The page buffer group 230 detects memory cells having a threshold voltage higher than the second monitoring read voltage 2nd MR among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage higher than the second monitoring read voltage 2nd MR using the sensing voltage VPB.

A threshold voltage (end point (right)) of a memory cell having a maximum threshold voltage among the memory cells of which the threshold voltage is increased is calculated based on the number of the memory cells having the threshold voltage higher than the first monitoring read voltage 1st MR and the number of the memory cells having the threshold voltage higher than the second monitoring read voltage 2nd MR. That is, a right tail value is calculated among the threshold voltage distribution of the memory cells programmed to the solid program state. For example, a maximum threshold voltage value (end point (right)) is calculated based on a voltage difference between the first monitoring read voltage 1st MR and the second monitoring read voltage 2nd MR and a difference value between the number of the memory cells having the threshold voltage higher than the first monitoring read voltage 1st MR and the number of the memory cells having the threshold voltage higher than the second monitoring read voltage 2nd MR.

In an embodiment of the present disclosure, the threshold voltage of the memory cell having the maximum threshold voltage among the memory cells of which the threshold voltage is increased is calculated based on the number of the memory cells having the threshold voltage higher than the first monitoring read voltage 1st MR and the number of the memory cells having the threshold voltage higher than the second monitoring read voltage 2nd MR. However, in order to increase accuracy of the maximum threshold voltage value, the first threshold voltage monitoring operation may be performed using a voltage equal to the highest threshold voltage of the normal solid program state SPT and at least two or more monitoring read voltages higher than the threshold voltage.

Thereafter, the first threshold voltage distribution monitoring operation described above is performed on the next physical page PPG.

The first threshold voltage distribution monitoring operation for all of the physical pages included in the memory block is performed in the method described above to detect the memory cells having the threshold voltage higher than the first monitoring read voltage 1st MR among the plurality of memory cells included in the selected memory block. In addition, a threshold voltage value of the memory cell having the highest threshold voltage among the detected memory cells may be calculated and measured.

The first threshold voltage distribution monitoring operation described above may be performed on all of the memory blocks 11 included in the semiconductor memory 100, and information on the number of the detected memory cells of each of the memory blocks 11 and the maximum threshold voltage value may be output to the controller 1200.

The first threshold voltage distribution monitoring operation according to yet another embodiment of the present disclosure will be described with reference to FIGS. 3 and 9 as follows.

A first threshold voltage distribution monitoring operation for the selected physical page PPG is performed. The voltage generation circuit 210 generates a first monitoring read voltage 1st MR and the pass voltage in response to the operation signal OP_CMD, and the row decoder 220 applies the first monitoring read voltage 1st MR to the selected word line of the selected memory block and applies the pass voltage to the remaining unselected word lines. The first monitoring read voltage 1st MR is preferably the same voltage as the highest threshold voltage of the normal solid program state SPT. The page buffer group 230 detects memory cells having a threshold voltage higher than the first monitoring read voltage 1st MR among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage higher than the first monitoring read voltage 1st MR using the sensing voltage VPB.

Thereafter, the voltage generation circuit 210 generates a second monitoring read voltage 2nd MR and the pass voltage in response to the operation signal OP_CMD, and the row decoder 220 applies the second monitoring read voltage 2nd MR to the selected word line of the selected memory block and applies the pass voltage to the remaining unselected word lines. The second monitoring read voltage 2nd MR is preferably higher than the first monitoring read voltage 1st MR by a step voltage ΔV. The page buffer group 230 detects memory cells having a threshold voltage higher than the second monitoring read voltage 2nd MR among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage higher than the second monitoring read voltage 2nd MR using the sensing voltage VPB.

When the number of the memory cells having the threshold voltage higher than the second monitoring read voltage 2nd MR is greater than a set number (for example, 1), a third monitoring read voltage 3rd MR higher than the second monitoring read voltage 2nd MR by the step voltage ΔV is applied to the selected word line and the potential level or the current amount of the bit lines BL1 to BLm is sensed to detect memory cells having a threshold voltage higher the third monitoring read voltage 3rd MR.

As described above, the monitoring read voltage (for example, 1st MR to 6th MR) is gradually increased by the step voltage ΔV and is applied, and the monitoring read voltage (for example, 6th MR) applied when the number of the memory cells having the threshold voltage higher than the applied monitoring read voltage is equal to or less than the set number is determined as a maximum threshold voltage value (end point (right)) of a corresponding page by sensing the potential level or the current amount of the bit lines BL1 to BLm.

Thereafter, the first threshold voltage distribution monitoring operation is performed on the next physical page PPG to detect the number of the memory cells having the threshold voltage higher than the first monitoring read voltage 1st MR and the maximum threshold voltage value (end point (right)).

The first threshold voltage distribution monitoring operation for all of the physical pages included in the memory block may be performed to detect the memory cells having the threshold voltage higher than the first monitoring read voltage 1st MR among the plurality of memory cells included in the selected memory block, and the threshold voltage value of the memory cell having the highest threshold voltage among the detected memory cells may be measured.

The first threshold voltage distribution monitoring operation described above may be performed on all of the memory blocks 11 included in the semiconductor memory 100, and information on the number of the detected memory cells of each of the memory blocks 11 and the maximum threshold voltage value may be output to the controller 1200.

After performing the first threshold voltage distribution monitoring operation S630 of FIG. 6, each of the plurality of semiconductor memories 100 of the memory device 1100 performs the test erase operation of each memory block in response to the internal command CMD (S640).

The test erase operation may be an operation of erasing the memory cells of the solid program state SPT to a soft erase state (SET) as shown in FIG. 10. The soft erase state SET has a threshold voltage distribution lower than the solid program state SPT and may have a threshold voltage distribution higher than 0 V.

The test erase operation may be performed by applying an erase voltage lower than an erase voltage used during a normal erase operation of the semiconductor memory to the source line SL of the selected memory block. For example, when an erase voltage of 18 V is applied to the source line SL during the normal erase operation, an erase voltage of 9 V may be applied to the source line SL during the test erase operation.

Each of the plurality of semiconductor memories 100 of the memory device 1100 performs the second threshold voltage distribution monitoring operation of each memory block in response to the internal command CMD (S650).

After the memory cells included in the semiconductor memory 100 are test-erased to the soft erase state SET, a threshold voltage of some memory cells may be lower than that of the soft erase state SET in which the threshold voltage is normal as shown in FIG. 11. Such memory cells may be lowered in a threshold voltage distribution than other memory cells during the erase operation and may not be programmed to a normal state during the next program operation, thereby reducing the reliability of the semiconductor memory 100. The second threshold voltage distribution monitoring operation is an operation of checking the memory cells having the threshold voltage lower than the threshold voltage distribution of the normal soft erase state SET after the test erase operation S640.

The second threshold voltage distribution monitoring operation according to an embodiment of the present disclosure will be described with reference to FIGS. 3 and 11 as follows.

First a second threshold voltage distribution monitoring operation for the selected physical page PPG is performed. The voltage generation circuit 210 generates a first monitoring read voltage 1st MR' and the pass voltage in response to the operation signal OP_CMD, and the row decoder 220 applies the first monitoring read voltage 1st MR' to the selected word line of the selected memory block and applies the pass voltage to the remaining unselected word lines. The first monitoring read voltage 1st MR' is preferably the same voltage as the lowest threshold voltage of the normal soft erase state SET. The page buffer group 230 detects memory cells having a threshold voltage lower than the first monitoring read voltage 1st MR' among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage lower than the first monitoring read voltage 1st MR' using the sensing voltage VPB. In an embodiment, the page buffer group 230 detects memory cells having a threshold voltage lower than a normal threshold voltage range among the memory cells (i.e., using the first monitoring read voltage $1^{st}$ MR' as a voltage that is the lowest threshold voltage of the normal soft erase state SET) included in one physical page PPG corresponding to the selected word line by sensing a potential level or a current amount of the bit lines BL1 to BLm, and generates the sensing voltage VPB corresponding to the number of the detected memory cells.

Thereafter, the second threshold voltage distribution monitoring operation described above is performed on the next physical page PPG.

The second threshold voltage distribution monitoring operation for all of the physical pages included in the memory block is performed in the method described above to detect the memory cells having the threshold voltage lower than the first monitoring read voltage 1st MR' among the plurality of memory cells included in the selected memory block.

The second threshold voltage distribution monitoring operation described above may be performed on all of the memory blocks 11 included in the semiconductor memory 100, and information on the number of the detected memory cells of each of the memory blocks 11 may be output to the controller 1200.

The second threshold voltage distribution monitoring operation according to another embodiment of the present disclosure will be described with reference to FIGS. 3 and 11 as follows.

A second threshold voltage distribution monitoring operation for the selected physical page PPG is performed. The voltage generation circuit 210 generates a first monitoring read voltage 1st MR' and the pass voltage in response to the operation signal OP_CMD, and the row decoder 220 applies the first monitoring read voltage 1st MR' to the selected word line of the selected memory block and applies the pass voltage to the remaining unselected word lines. The first monitoring read voltage 1st MR' is preferably the same voltage as the lowest threshold voltage of the normal soft erase state SET. The page buffer group 230 detects memory cells having a threshold voltage lower than the first monitoring read voltage 1st MR' among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage lower than the first monitoring read voltage 1st MR' using the sensing voltage VPB.

Thereafter, the voltage generation circuit 210 generates a second monitoring read voltage 2nd MR' and the pass voltage in response to the operation signal OP_CMD, and the row decoder 220 applies the second monitoring read voltage 2nd MR' to the selected word line of the selected memory block and applies the pass voltage to the remaining unselected word lines. The second monitoring read voltage 2nd MR' is preferably lower than the first monitoring read voltage 1st MR'. The page buffer group 230 detects memory cells having a threshold voltage lower than the second monitoring read voltage 2nd MR' among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage lower than the second monitoring read voltage 2nd MR' using the sensing voltage VPB.

A threshold voltage (end point (left)) of a memory cell having a minimum threshold voltage among the memory cells of which the threshold voltage is reduced is calculated based on the number of the memory cells having the threshold voltage lower than the first monitoring read voltage 1st MR' and the number of the memory cells having the threshold voltage lower than the second monitoring read voltage 2nd MR'. That is, a left tail value is calculated among the threshold voltage distribution of the memory cells programmed to the soft erase state. For example, a minimum threshold voltage value (end point (left)) is calculated based on a voltage difference between the first monitoring read voltage 1st MR' and the second monitoring read voltage 2nd MR' and a difference value between the number of the memory cells having the threshold voltage lower than the first monitoring read voltage 1st MR' and the number of the memory cells having the threshold voltage lower than the second monitoring read voltage 2nd MR'.

In the embodiment of the present disclosure, the threshold voltage of the memory cell having the minimum threshold voltage among the memory cells of which the threshold voltage is reduced is calculated based on the number of the memory cells having the threshold voltage lower than the first monitoring read voltage 1st MR' and the number of the memory cells having the threshold voltage lower than the second monitoring read voltage 2nd MR'. However, in order to increase accuracy of the minimum threshold voltage value, the second threshold voltage monitoring operation may be performed using a voltage equal to the lowest threshold voltage of the normal soft erase state SET and at least two or more monitoring read voltages lower than the threshold voltage.

Thereafter, the second threshold voltage distribution monitoring operation described above is performed on the next physical page PPG.

The second threshold voltage distribution monitoring operation for all of the physical pages included in the memory block is performed in the method described above to detect the memory cells having the threshold voltage lower than the first monitoring read voltage 1st MR' among the plurality of memory cells included in the selected memory block. In addition, a threshold voltage value of the memory cell having the lowest threshold voltage among the detected memory cells may be calculated and measured.

The second threshold voltage distribution monitoring operation described above may be performed on all of the memory blocks 11 included in the semiconductor memory 100, and information on the number of the detected memory cells of each of the memory blocks 11 and the maximum threshold voltage value may be output to the controller 1200.

The second threshold voltage distribution monitoring operation according to yet another embodiment of the present disclosure will be described with reference to FIGS. 3 and 12 as follows.

A second threshold voltage distribution monitoring operation for the selected physical page PPG is performed. The voltage generation circuit 210 generates a first monitoring read voltage 1st MR' and the pass voltage in response to the operation signal OP_CMD, and the row decoder 220 applies the first monitoring read voltage 1st MR' to the selected word line of the selected memory block and applies the pass voltage to the remaining unselected word lines. The first monitoring read voltage 1st MR' is preferably the same voltage as the lowest threshold voltage of the normal soft erase state SET. The page buffer group 230 detects memory cells having a threshold voltage lower than the first monitoring read voltage 1st MR' among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage lower than the first monitoring read voltage 1st MR' using the sensing voltage VPB.

Thereafter, the voltage generation circuit 210 generates a second monitoring read voltage 2nd MR' and the pass voltage in response to the operation signal OP_CMD, and the row decoder 220 applies the second monitoring read voltage 2nd MR' to the selected word line of the selected memory block and applies the pass voltage to the remaining unselected word lines. The second monitoring read voltage 2nd MR is preferably lower than the first monitoring read voltage 1st MR by a step voltage. The page buffer group 230 detects memory cells having a threshold voltage lower than the second monitoring read voltage 2nd MR' among the memory cells included in one physical page PPG corresponding to the selected word line by sensing a potential level or a current amount of the bit lines BL1 to BLm, and generates the sensing voltage VPB corresponding to the number of the detected memory cells. The pass/fail determiner 260 counts the number of the memory cells having the threshold voltage lower than the second monitoring read voltage 2nd MR' using the sensing voltage VPB.

When the number of the memory cells having the threshold voltage lower than the second monitoring read voltage 2nd MR' is greater than a set number (for example, 1), a third monitoring read voltage 3rd MR' lower than the second monitoring read voltage 2nd MR' by the step voltage is applied to the selected word line and the potential level or the current amount of the bit lines BL1 to BLm is sensed to detect memory cells having a threshold voltage lower than the third monitoring read voltage 3rd MR.

As described above, the monitoring read voltage (for example, 1st MR' to 5th MR') is gradually reduced by the step voltage and is applied, and the monitoring read voltage (for example, 6th MR') applied when the number of the memory cells having the threshold voltage higher than the applied monitoring read voltage is equal to or less than the set number is determined as a minimum threshold voltage value (end point (left)) of a corresponding page by sensing the potential level or the current amount of the bit lines BL1 to BLm.

Thereafter, the second threshold voltage distribution monitoring operation is performed on the next physical page PPG to detect the number of the memory cells having the threshold voltage lower than the first monitoring read voltage 1st MR' and the minimum threshold voltage value (end point (left)).

The second threshold voltage distribution monitoring operation for all of the physical pages included in the memory block may be performed to detect the memory cells having the threshold voltage lower than the first monitoring read voltage 1st MR' among the plurality of memory cells included in the selected memory block, and the threshold voltage value of the memory cell having the lowest threshold voltage among the detected memory cells may be measured.

The second threshold voltage distribution monitoring operation described above may be performed on all of the memory blocks 11 included in the semiconductor memory 100, and information on the number of the detected memory cells of each of the memory blocks 11 and the minimum threshold voltage value may be output to the controller 1200.

The memory performance control block 1240 of the controller 1200 determines the reliability level of the plurality of memory blocks included in the memory device 1100 based on the results of the first threshold voltage distribution monitoring operation and the second threshold voltage distribution monitoring operation of the memory device 1100 of FIG. 1 (S660). For example, the memory performance control block 1240 determines and classifies the reliability levels of each of the plurality of memory blocks included in the memory device 1100 as any one of the plurality of reliability classes based on the number of the memory cells having the threshold voltage higher than the threshold voltage distribution of the normal solid program state and the maximum threshold value, which are received as the result of the first threshold voltage distribution monitoring operation, and the number of the memory cells having the threshold voltage lower than the threshold voltage distribution of the normal soft erase state and the minimum threshold value, which are received as the result of the second threshold voltage distribution monitoring operation.

The memory performance control block 1240 sets or resets the operation performance parameters of each of the plurality of memory blocks 11 based on the classified reliability class (S670).

The processor 1220 may check an operation performance parameter of a corresponding semiconductor memory during all operations of the corresponding semiconductor memory and control all operations of the corresponding semiconductor memory based on operation performance parameter.

As described above, according to an embodiment of the present disclosure, when the test operation is requested from the host 1300, the test program operation, the first threshold voltage distribution monitoring operation, the test erase operation, and the second threshold voltage distribution monitoring operation of each of the memory blocks included in the memory device 1100 may be performed to determine the reliability level of each memory block and set the operation performance parameters of each memory block based on the determined reliability level. That is, a garbage collection operation cycle, threshold voltage distribution positions corresponding to each program state, a maximum erase count specification, a read reclaim cycle, the number of read voltages used during a read retry operation, and the like may be adjusted based on the reliability levels of each memory block, thereby improving the reliability and lifetime of the memory system.

In an embodiment of the present disclosure described above, performing the test program operation, the first threshold voltage distribution monitoring operation, the test erase operation, and the second threshold voltage distribution monitoring operation on all of the physical pages included in the memory blocks to set the operation performance parameters of the memory block has been described as an example. However, at least one representative physical page may be selected among the physical pages included in the memory blocks, and the test program operation, the first threshold voltage distribution monitoring operation, the test erase operation, and the second threshold voltage distribution monitoring operation may be performed on the selected representative physical page to set the operation performance parameter of the corresponding memory block.

Figure 13:
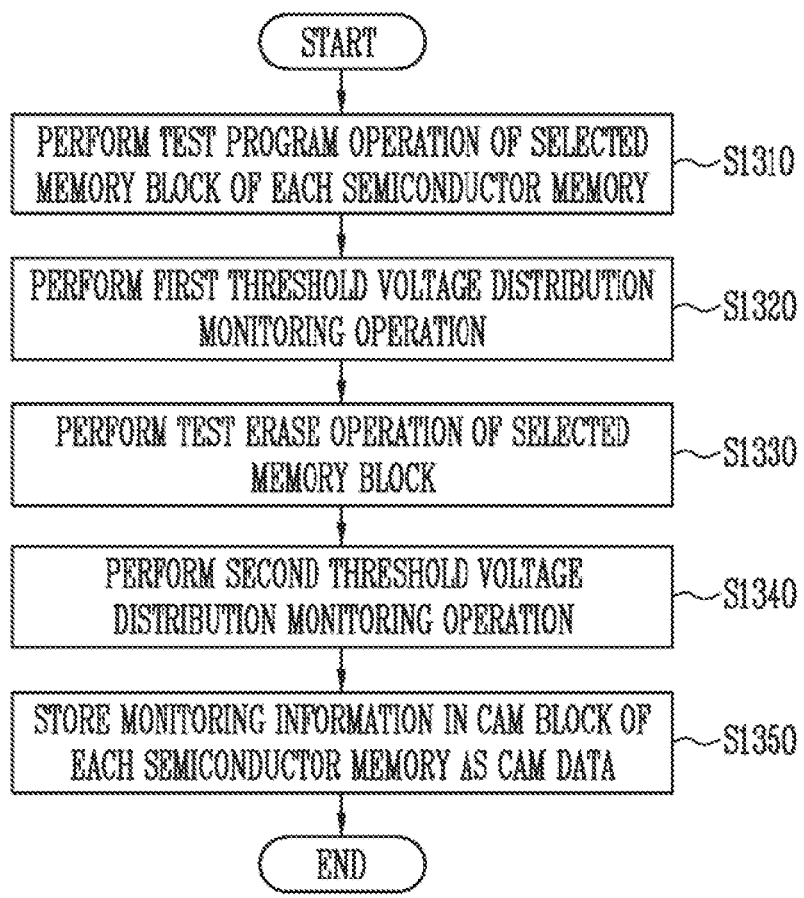
FIG. 13 is a flowchart for describing a test operation of semiconductor memories according to an embodiment of the present disclosure.

FIG. 13 is a flowchart for describing a test operation of semiconductor memories according to an embodiment of the present disclosure.

The test operation of the semiconductor memories described below may be performed at a wafer level.

The test program operation is performed on at least one selected memory block (for example, MB2) among the plurality of memory blocks included in each of the semiconductor memories (S1310). At this time, the selected memory block may be selected in consideration of a disposition position in the memory cell array 10, except for the cam block (for example, MB1) among the plurality of memory blocks 11. For example, the test program operation may be performed by selecting memory blocks arranged in a center area and an edge area of the memory cell array 10.

The test program operation may be performed in a method similar to that of the test program operation (S620) described above with reference to FIG. 6. That is, the memory cells included in the selected memory block MB2 are programmed to the solid program state SPT.

When the test program operation S1310 is completed, the first threshold voltage distribution monitoring operation is performed (S1320).

The first threshold voltage distribution monitoring operation may be performed in a method similar to that of the first threshold voltage distribution monitoring operation S630 described above with reference to FIG. 6. At this time, the first threshold voltage distribution monitoring operation is performed on some of the memory blocks on which the test program operation is performed among all of the memory blocks included in the memory cell array 10.

As a result of the first threshold voltage distribution monitoring operation, the number of the memory cells having the threshold voltage higher than the first monitoring read voltage 1st MR among the memory cells included in the selected memory block and the maximum threshold voltage value may be measured.

Thereafter, the test erase operation is performed on the selected memory block MB2 (S1330). The test erase operation may be performed in a method similar to that of the test erase operation S640 described above with reference to FIG. 6. That is, the memory cells included in the selected memory block MB2 are erased from the solid program state SPT to the soft erase state SET.

Thereafter, the second threshold voltage distribution monitoring operation is performed (S1340).

The second threshold voltage distribution monitoring operation may be performed in a method similar to that of the second threshold voltage distribution monitoring operation S650 described above with reference to FIG. 6. As a result of the second threshold voltage distribution monitoring, the number of the memory cells having the threshold voltage lower than the first monitoring read voltage 1st MR' among the memory cells included in the selected memory block and the minimum threshold voltage value may be measured.

The monitoring information obtained as the result of the above-described first threshold voltage distribution monitoring operation and the monitoring information obtained as a result of the second threshold voltage distribution monitoring operation are programmed in the cam block (for example, MB1) of the memory cell array 10 as the cam data (S1350). That is, the number of the memory cells having the threshold voltage higher than the first monitoring read voltage 1st MR, the maximum threshold voltage value, the number of the memory cells having the threshold voltage lower than the first monitoring read voltage 1st MR, and the minimum threshold voltage value are programmed in the cam block (for example, MB1) as the cam data.

As described above, in an embodiment of the present disclosure, the test program operation, the first threshold voltage distribution monitoring operation, the test erase operation, and the second threshold voltage distribution monitoring operation may be performed on some of the selected memory blocks among the plurality of memory blocks in the wafer level test of the semiconductor memory, and the monitoring information obtained as the result of the threshold voltage distribution monitoring operation may be stored in the cam block.

In an embodiment of the present disclosure described above, performing the test program operation, the first threshold voltage distribution monitoring operation, the test erase operation, and the second threshold voltage distribution monitoring operation on all of the physical pages included in the selected memory block among the plurality of memory blocks included in the semiconductor memory to set the operation performance parameters of the memory block has been described as an example. However, at least one representative physical page may be selected among the physical pages included in the memory blocks, and the test program operation, the first threshold voltage distribution monitoring operation, the test erase operation, and the second threshold voltage distribution monitoring operation may be performed on the selected representative physical page. At this time, the selected representative physical page may be a worst physical page of which an electrical characteristic is vulnerable among the physical pages included in the memory block.

Figure 14:
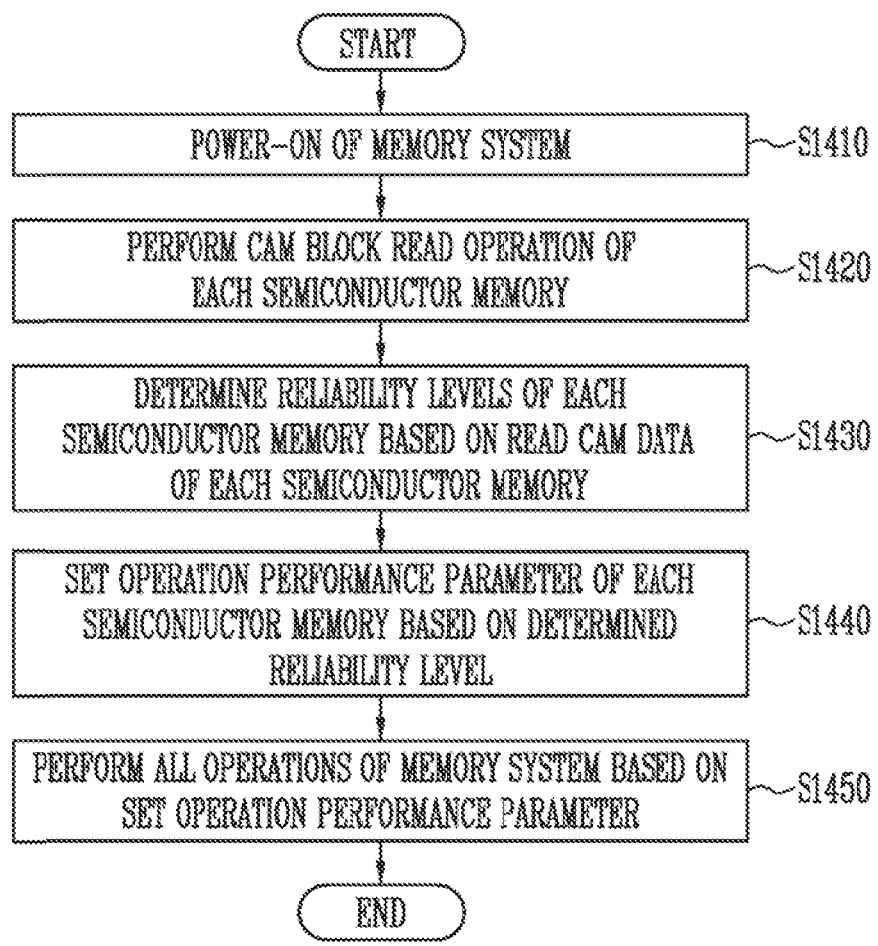
FIG. 14 is a flowchart for describing a method of operating a memory system according to another embodiment of the present disclosure.

FIG. 14 is a flowchart for describing a method of operating a memory system according to another embodiment of the present disclosure.

A method of operating a memory system according to another embodiment of the present disclosure will be described with reference to FIGS. 1, 3, and 14 as follows.

In another embodiment of the present disclosure, each of the plurality of semiconductor memories 100 included in the memory device 1100 performs the test operation at the wafer level as described above with reference to FIG. 13, and the monitoring information is programmed in the cam block, as an example.

When a power voltage is applied to the memory system 1000 and a power-on operation is performed (S1410), the processor 1220 generates a command queue to perform a cam data read operation. The flash control block 1260 generates and outputs an internal command CMD for controlling the cam data read operation of the plurality of semiconductor memories 100 in response to the command queue.

Each of the plurality of semiconductor memories 100 reads the cam data stored in the cam block MB1 in response to the internal command CMD and transmits the read cam data to the memory performance control block 1240 of the controller 1200 (S1420).

The memory performance control block 1240 determines the reliability levels of each semiconductor memory 100 based on the cam data (S1430). For example, the memory performance control block 1240 determines and classifies the reliability levels of each of the plurality of semiconductor memories 100 included in the memory device 1100 as any one among the plurality of reliability classes based on the first and second threshold voltage distribution monitoring information included in the cam data read from each semiconductor memory.

The memory performance control block 1240 sets or resets the operation performance parameters of each of the plurality of semiconductor memories 100 based on the classified reliability class (S1440). For example, when the reliability level of the semiconductor memory is a high class, the garbage collection operation cycle, the maximum erase count specification, and the read reclaim cycle may be increased and the number of the read voltages used during the read retry operation may be reduced. In addition, when the reliability level is a low class, the garbage collection operation cycle, the maximum erase count specification, and the read reclaim cycle may be reduced, the number of the read voltages used during the read retry operation may be reduced, a threshold voltage distribution of a program state having a relatively high threshold voltage distribution among the plurality of program states may be increased, and a threshold voltage distribution of a program state having a relatively low threshold voltage distribution may be reduced.

When the host command Host_CMD corresponding to all operations of a corresponding semiconductor memory is received from the host 1300, the processor 1220 controls all operations of when the host command Host_CMD corresponding semiconductor memory, checks the operation performance parameter of the corresponding semiconductor memory, and controls all operations of the semiconductor memory based on the operation performance parameter (S1450).

As described above, according to an embodiment of the present disclosure, the test program operation, the first threshold voltage distribution monitoring operation, the test erase operation, and the second threshold voltage distribution monitoring operation are performed at the wafer level of the semiconductor memory, and the monitoring information obtained as the result of the first and second threshold voltage distribution monitoring operation is stored in the cam blocks of each semiconductor memory as the cam data. Thereafter, the semiconductor memories and the controller are packaged to manufacture the memory system. The read operation is performed on the cam block of each semiconductor memory during the power-on operation of the memory system, and the reliability levels of each semiconductor memory is determined based on the read cam data. The operation performance parameters of each semiconductor memory block may be set based on the determined reliability level. That is, a garbage collection operation cycle, threshold voltage distribution positions corresponding to each program state, a maximum erase count specification, a read reclaim cycle, the number of read voltages used during a read retry operation, and the like may be adjusted based on the reliability levels of each memory block, thereby improving the reliability and lifetime of the memory system.

Figure 15:
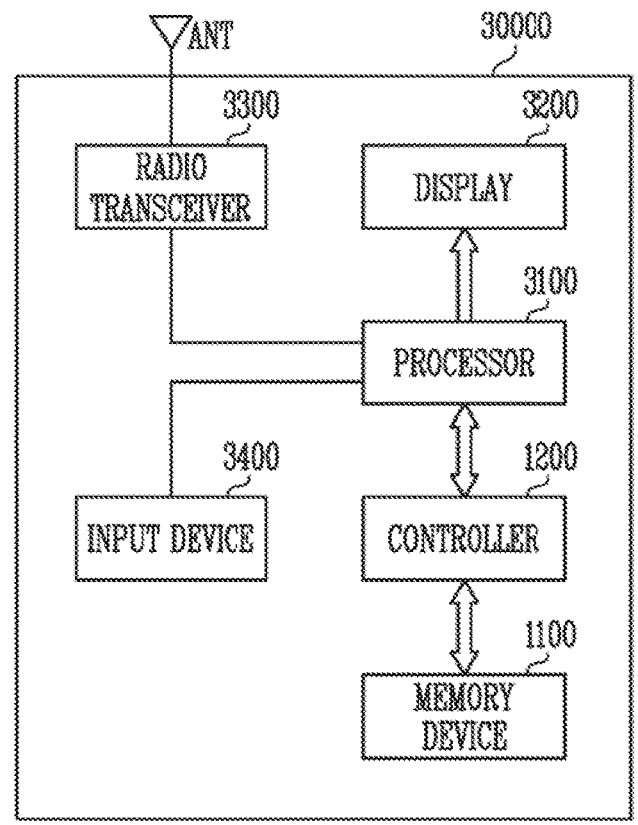
FIG. 15 is a diagram for describing another embodiment of the memory system.

FIG. 15 is a diagram for describing another embodiment of the memory system.

Referring to FIG. 15, a memory system 30000 may be implemented as a cellular phone, a smart phone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of memory device 1100 may be implemented as a part of the processor 3100 and may also be implemented as a chip separate from the processor 3100. In addition, the controller 1200 may be implemented through the example of the controller shown in FIG. 2. In addition, the memory device 1100 may be implemented though the examples of the semiconductor memories 100 shown in FIG. 3.

Figure 16:
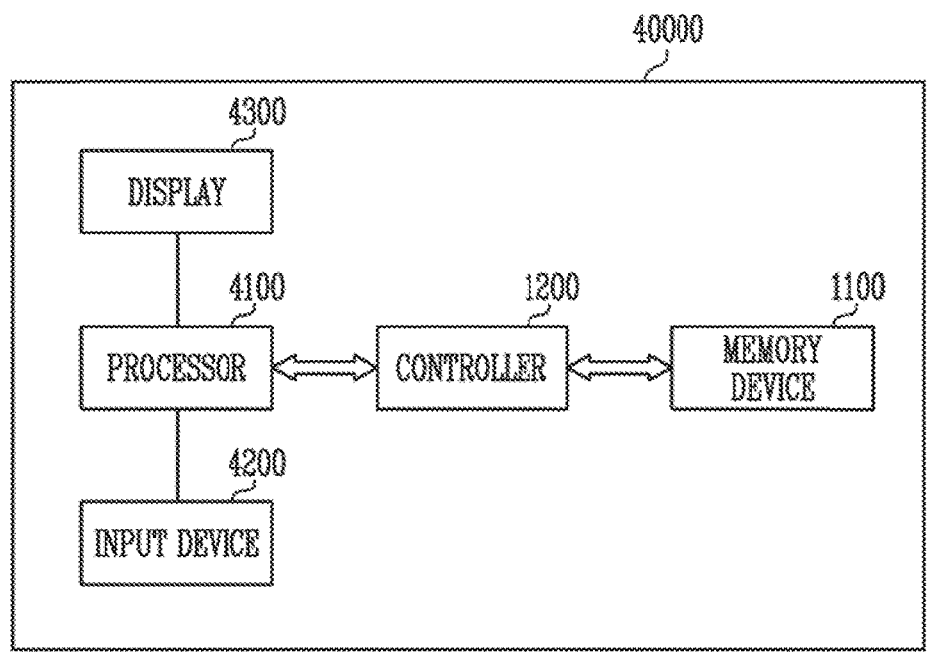
FIG. 16 is a diagram for describing another embodiment of the memory system.

FIG. 16 is a diagram for describing another example of the memory system.

Referring to FIG. 16, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the controller 1200. According to an embodiment, the controller 1200 capable of controlling the operation of memory device 1100 may be implemented as a part of the processor 4100 or may be implemented as a chip separate from the processor 4100. In addition, the controller 1200 may be implemented through the example of the controller shown in FIG. 2. In addition, the memory device 1100 may be implemented though the examples of the semiconductor memories 100 shown in FIG. 3.

Figure 17:
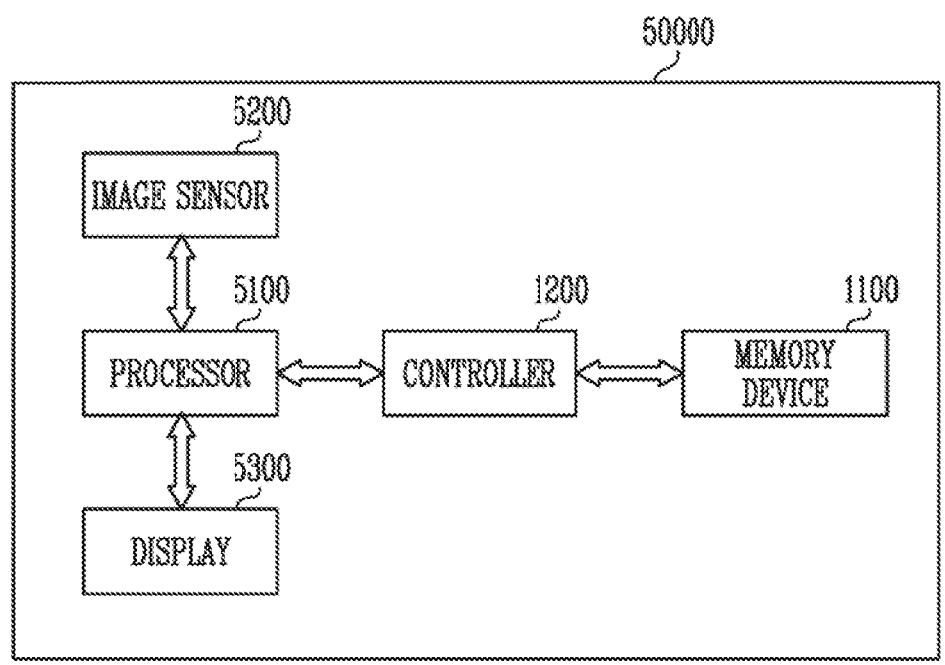
FIG. 17 is a diagram for describing another embodiment of the memory system.

FIG. 17 is a diagram for describing another embodiment of the memory system.

Referring to FIG. 17, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored in the memory device 1100 through the controller 1200. In addition, data stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip separate from the processor 5100. In addition, the controller 1200 may be implemented through the example of the controller shown in FIG. 2. In addition, the memory device 1100 may be implemented though the examples of the semiconductor memories 100 shown in FIG. 3.

Figure 18:
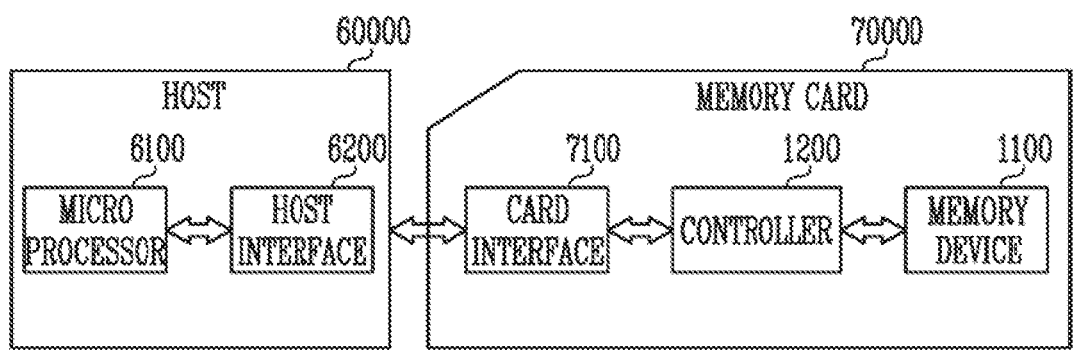
FIG. 18 is a diagram for describing another embodiment of the memory system.

FIG. 18 is a diagram for describing another embodiment of the memory system.

Referring to FIG. 18, a memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the controller 1200 may be implemented through the example of the controller 1200 shown in FIG. 2. In addition, the memory device 1100 may be implemented though the examples of the semiconductor memories 100 shown in FIG. 3.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

Although the present disclosure has been described with reference to the embodiments and drawings, the present disclosure is not limited to the embodiments described above, and various changes and modifications may be made from the disclosed description by those skilled in the art to which the present disclosure pertains.

Therefore, the scope of the present disclosure should not be limited to the described embodiments, and should be determined by the equivalents of the claims as well as the following claims.

In the embodiments described above, all of the steps may optionally be performed or omitted. In addition, the steps in each embodiment need not occur in order, and may be reversed. Meanwhile, the embodiments of the present disclosure disclosed in the present specification and the drawings are merely specific examples for easily describing the technical content of the present specification and facilitating understanding of the present specification and do not limit the scope of the present specification. That is, it is apparent to those skilled in the art to which the present disclosure pertains that other modification examples based on the technical spirit of the present disclosure are possible.

Meanwhile, the present specification and drawings disclose embodiments of the present disclosure. Although specific terms are used, they are used in general meaning for purposes of easily describing technical content of the present disclosure and facilitating understanding of the present disclosure, and are not intended to limit the scope of the present disclosure. It is apparent to those skilled in the art to which the present disclosure pertains that other modification examples based on the technical spirit of the present disclosure may be carried out in addition to the embodiments disclosed herein.

What is claimed is:

1. A memory system comprising:
a memory device including a plurality of semiconductor memories; and
a controller for controlling the memory device to perform a test program operation and a first threshold voltage distribution monitoring operation on each of the plurality of semiconductor memories during an operation,
wherein the controller sets operation performance parameters of each of the semiconductor memories based on first monitoring information obtained as a result of the first threshold voltage distribution monitoring operation,
wherein each of the plurality of semiconductor memories includes a plurality of memory blocks, and each of the plurality of semiconductor memories programs the plurality of memory blocks to a solid program state during the test program operation, and
wherein each of the plurality of semiconductor memories detects a number of first memory cells having a threshold voltage higher than a normal threshold voltage range of the solid program state among memory cells included in the plurality of memory blocks during the first threshold voltage distribution monitoring operation.

2. The memory system of claim 1, wherein the controller controls the memory device to perform a test erase operation and a second threshold voltage distribution monitoring operation on each of the plurality of semiconductor memories after performing the first threshold voltage distribution monitoring operation during the operation, and sets the operation performance parameters based on second monitoring information obtained as a result of the second threshold voltage distribution monitoring operation and the first monitoring information.

3. The memory system of claim 1, wherein the solid program state is one of a plurality of program states.

4. The memory system of claim 1, wherein each of the plurality of semiconductor memories performs the first threshold voltage distribution monitoring operation on each of the plurality of memory blocks, measures the number of the first memory cells having a threshold voltage higher than a first monitoring read voltage equal to the highest threshold voltage of the normal threshold voltage range and a number of second memory cells having a threshold voltage higher than a second monitoring read voltage during the first threshold voltage distribution monitoring operation, and calculates a maximum threshold voltage value of the memory cells based on the number of the first memory cells and the number of the second memory cells, and the second monitoring read voltage is higher than the first monitoring read voltage.

5. The memory system of claim 4, wherein each of the plurality of semiconductor memories transmits the first monitoring information including the number of the first memory cells and the maximum threshold voltage value of each of the plurality of memory blocks to the controller.

6. The memory system of claim 2, wherein each of the plurality of semiconductor memories erases the plurality of memory blocks, which are programmed to the solid program state, to a soft erase state during the test erase operation.

7. The memory system of claim 6, wherein the soft erase state has a threshold voltage distribution higher than 0 V (volts), and each of the plurality of semiconductor memories performs the test erase operation using an erase voltage having a potential level lower than a normal erase voltage of a normal erase operation during the test erase operation.

8. The memory system of claim 6, wherein each of the plurality of semiconductor memories detects a number of third memory cells having a threshold voltage lower than a normal threshold voltage range of the soft erase state among memory cells included in the plurality of memory blocks during the second threshold voltage distribution monitoring operation.

9. The memory system of claim 8, wherein each of the plurality of semiconductor memories performs the second threshold voltage distribution monitoring operation on each of the plurality of memory blocks, measures the number of the third memory cells having a threshold voltage lower than a third monitoring read voltage equal to the lowest threshold voltage of the normal threshold voltage range and a number of fourth memory cells having a threshold voltage lower than a fourth monitoring read voltage during the second threshold voltage distribution monitoring operation, and calculates a minimum threshold voltage value of the memory cells based on the number of the third memory cells and the number of the fourth memory cells, and the fourth monitoring read voltage is lower than the third monitoring read voltage.

10. The memory system of claim 9, wherein each of the plurality of semiconductor memories transmits the second monitoring information including the number of the third memory cells and the minimum threshold voltage value of each of the plurality of memory blocks to the controller.

11. The memory system of claim 1, wherein the operation performance parameter includes at least one of a garbage collection operation cycle, a maximum erase count specification, a read reclaim cycle, a number of read voltages used during a read retry operation, and threshold voltage distribution positions of each of a plurality of program states, of each of the plurality of memory blocks included in each of the plurality of semiconductor memories.

12. A memory system comprising:

a memory device including a plurality of semiconductor memories each including a plurality of memory blocks; and a controller configured to control the memory device to perform a content addressable memory (cam) data read operation during a power-on operation and set operation performance parameters of each of the semiconductor memories based on cam data received from the memory device, wherein each of the plurality of semiconductor memories sequentially performs a test program operation, a first threshold voltage distribution monitoring operation, a test erase operation, and a second threshold voltage distribution monitoring operation, and stores monitoring information obtained as a result of the first and second threshold voltage distribution monitoring operations in a cam block among the plurality of memory blocks as the cam data.

13. The memory system of claim 12, wherein the operation performance parameter includes at least one of a garbage collection operation cycle, a maximum erase count specification, a read reclaim cycle, the number of read voltages used during a read retry operation, and threshold voltage distribution positions of each of a plurality of program states, of each of the plurality of memory blocks included in each of the plurality of semiconductor memories.

14. The memory system of claim 12, wherein each of the plurality of semiconductor memories programs at least one selected memory block of the plurality of memory blocks to a solid program state during the test program operation, and the solid program state is one program state of a plurality of program states.

15. The memory system of claim 14, wherein each of the plurality of semiconductor memories performs the first threshold voltage distribution monitoring operation on the at least one selected memory block of the plurality of memory blocks, measures a number of first memory cells having a threshold voltage higher than a first monitoring read voltage equal to the highest threshold voltage of a normal threshold voltage range of the solid program state and a number of second memory cells having a threshold voltage higher than a second monitoring read voltage during the first threshold voltage distribution monitoring operation, and calculates a maximum threshold voltage value of the memory cells based on the number of the first memory cells and the number of the second memory cells, and the second monitoring read voltage is higher than the first monitoring read voltage.

16. The memory system of claim 14, wherein each of the plurality of semiconductor memories erases the at least one selected memory block to a soft erase state during the test erase operation, and the soft erase state has a threshold voltage distribution higher than 0 V (volts).

17. The memory system of claim 16, wherein each of the plurality of semiconductor memories performs the second threshold voltage distribution monitoring operation on the at least one selected memory block of the plurality of memory blocks, measures a number of third memory cells having a threshold voltage lower than a third monitoring read voltage equal to the lowest threshold voltage of a normal threshold voltage range of the soft erase state and a number of fourth memory cells having a threshold voltage lower than a fourth monitoring read voltage during the second threshold voltage distribution monitoring operation, and calculates a minimum threshold voltage value of the memory cells based on the number of the third memory cells and the number of the fourth memory cells, and the fourth monitoring read voltage is lower than the third monitoring read voltage.

18. A method of operating a memory system, the method comprising:

performing a test program operation and a first threshold voltage distribution monitoring operation on a selected memory block;

performing a test erase operation and a second threshold voltage distribution monitoring operation on the selected memory block on which the test program operation is performed;

setting an operation performance parameter of the selected memory block based on a result of the first threshold voltage distribution monitoring operation and a result of the second threshold voltage distribution monitoring operation;

performing all operations with reference to the operation performance parameter during all operations of the selected memory block;

storing monitoring information obtained as a result of the first threshold voltage distribution monitoring operation and a result of the second threshold voltage distribution monitoring operation in a content addressable memory (cam) block; and reading the monitoring information stored in the cam block during a power-on operation of the memory system.

19. The method of claim 18, wherein the operation performance parameter includes at least one of a garbage collection operation cycle, a maximum erase count specification, a read reclaim cycle, a number of read voltages used during a read retry operation, and threshold voltage distribution positions of each of a plurality of program states, of a corresponding memory block.

20. The method of claim 18, wherein the selected memory block is programmed to a solid program state during the test program operation, and the solid program state is one program state of a plurality of program states.

21. The method of claim 20, wherein the first threshold voltage distribution monitoring operation measures a number of first memory cells having a threshold voltage higher than a first monitoring read voltage equal to the highest threshold voltage of a normal threshold voltage range of the solid program state and a number of second memory cells having a threshold voltage higher than a second monitoring read voltage, among memory cells included in the selected memory block, and calculates a maximum threshold voltage value of the memory cells based on the number of the first memory cells and the number of the second memory cells, and the second monitoring read voltage is higher than the first monitoring read voltage.

22. The method of claim 18, wherein the selected memory block is erased to a soft erase state during the test erase operation, the soft erase state has a threshold voltage distribution higher than 0 V (volts).

23. The method of claim 22, wherein, during the second threshold voltage distribution monitoring operation, a number of third memory cells having a threshold voltage lower than a third monitoring read voltage equal to the lowest threshold voltage of a normal threshold voltage range of the soft erase state and a number of fourth memory cells having a threshold voltage lower than a fourth monitoring read voltage, among memory cells included in the selected memory block, and a minimum threshold voltage value of the memory cells based on the number of the third memory cells and the number of the fourth memory cells is calculated, and the fourth monitoring read voltage is lower than the third monitoring read voltage.

* * * * *